(12) United States Patent
Schaler et al.

(10) Patent No.: US 10,951,133 B2
(45) Date of Patent: Mar. 16, 2021

(54) REPULSIVE-ATTRACTIVE-FORCE ELECTROSTATIC ACTUATOR

(71) Applicant: The Regents of the University of California, Oakland, CA (US)

(72) Inventors: Ethan Weber Schaler, Berkeley, CA (US); Ronald S. Fearing, Berkeley, CA (US)

(73) Assignee: The Regents of The University of California, Oakland, CA (US)

(*) Notice: Subject to any disclaimer, the term of this patent is extended or adjusted under 35 U.S.C. 154(b) by 0 days.

(21) Appl. No.: 16/377,913

(22) Filed: Apr. 8, 2019

(65) Prior Publication Data

US 2019/0312528 A1 Oct. 10, 2019

Related U.S. Application Data

(60) Provisional application No. 62/654,067, filed on Apr. 6, 2018.

(51) Int. Cl.
*H02N 1/00* (2006.01)
*B81B 3/00* (2006.01)

(52) U.S. Cl.
CPC .......... *H02N 1/002* (2013.01); *B81B 3/0035* (2013.01); *B32B 2457/00* (2013.01); *B81B 2201/032* (2013.01); *B81B 2203/04* (2013.01)

(58) Field of Classification Search
CPC .......... H02N 1/04; H02N 1/004; H02N 1/006; H02N 1/06; B25J 9/12; B25J 7/00; G02B 26/0841; B41J 2/14314
USPC ................................. 310/300, 309
See application file for complete search history.

(56) References Cited

U.S. PATENT DOCUMENTS

| 2004/0189144 A1* | 9/2004 | Gondoh | H02N 1/004 310/309 |
| 2012/0268386 A1* | 10/2012 | Karamath | G06F 3/041 345/173 |
| 2017/0331397 A1* | 11/2017 | Kim | H02N 2/18 |

OTHER PUBLICATIONS

Baisch et al., "Pop-up assembly of a quadrupedal ambulatory MicroRobot," in IEEE IROS, pp. 1518-1524, 2013.
Chen et al., "A paper-based electrostatic zipper actuator for printable robots," in IEEE ICRA, p. 5038, 2014.
(Continued)

*Primary Examiner* — Thomas Truong
(74) *Attorney, Agent, or Firm* — Venable LLP; Henry J. Daley

(57) ABSTRACT

A repulsive-attractive-force electrostatic actuator according to some embodiments of the invention includes a first actuator layer including a first substrate, a first electrode pattern, and a second electrode pattern. The actuator further includes a second actuator layer including a second substrate, a third electrode pattern, and a fourth electrode pattern. The actuator further includes a first voltage source connected to the first and second electrode patterns such that the first electrode pattern is at a relative voltage of V1 to the second electrode pattern, and a second voltage source connected to the third and fourth electrode patterns such that the third electrode pattern is at a relative voltage of V2 to the fourth electrode pattern. The applied relative voltages V1 and V2 are selectable to provide one of a selected repulsive force or a selected attractive force between the first and second actuator layers.

22 Claims, 14 Drawing Sheets

(56) References Cited

OTHER PUBLICATIONS

Dharmawan et al., "Steerable miniature legged robot driven by a single piezoelectric bending unimorph actuator," in IEEE ICRA, pp. 6008-6013, 2017.
Donald et al., "An Untethered, Electrostatic, Globally Controllable Mems Micro-Robot," J. Microelectromech. Syst., vol. 15, No. 1, pp. 1-15, 2006.
Goldberg et al., "Power and Control Autonomy for High-Speed Locomotion With an Insect-Scale Legged Robot," IEEE RA-L, vol. 3, No. 2, pp. 987-993, 2018.
He et al., "Design, modeling, and demonstration of a MEMS repulsive-force out-of-plane electrostatic micro actuator," J. Microelectromech. Syst., vol. 17, No. 3, pp. 532-547, 2008.
He et al., "Large-stroke microelectrostatic actuators for vertical translation of micromirrors used in adaptive optics," IEEE Trans. Ind. Electron., vol. 52, No. 4, pp. 974-983, 2005.
He et al., "Performance assessment of a multi-level repulsive-force out-of-plane microelectrostatic actuator," Can. J. Elect. Comput. Eng., vol. 31, No. 2, pp. 71-75, 2006.
He et al., "Repulsive-force out-of-plane large stroke translation micro electrostatic actuator," J. Micromech. Microeng., vol. 21, No. 7, p. 075002, 2011.
Hoover et al., "RoACH: An autonomous 2.4 g crawling hexapod robot," IEEE IROS, pp. 26-33, 2008.
Lebey et al., "Influence of PWM-type voltage waveforms on reliability of machine insulation system," in IEEE Int. Conf. On Harmonics and Quality of Power, vol. 2, pp. 994-998, 1998.
Qi et al., "A fast-moving electrostatic crawling insect," in MEMS, p. 761, 2017.
Ren et al., "A Bi-Directional Out-of-Plane Actuator by Electrostatic Force," Micromachines, vol. 4, No. 4, pp. 431-443, 2013.
Schaler et al., "Multi-Layer, Thin-Film Repulsive-Force Electrostatic Actuators for a 2-DoF Micro-Mirror," in Actuators 2018 (to appear), (Bremen), p. 4, 2018.
Schaler et al., "Thin-film repulsive-force electrostatic actuators," Sens. Actuators. A Phys., vol. 270, pp. 252-261, 2018.
Shigemune et al., "Printed paper robot driven by electrostatic actuator," IEEE Robot. Autom. Lett., vol. 2, No. 2, p. 1001, 2017.
Tang et al., "Electrostatic comb drive levitation and control method," J. Microelectromech. Syst., 1992, vol. 1, No. 4, pp. 170-178.
Tee et al., "Adaptive Control of Electrostatic Microactuators With Bidirectional Drive," IEEE Trans. Control Syst. Technol, vol. 17, No. 2, pp. 340-352, 2009.
Towfighian et al., "A low voltage electrostatic micro actuator for large out-of-plane displacement," in ASME IDETC/CIE, pp. 1-7, 2014.
Wood et al., "Optimal energy density piezoelectric bending actuators," Sens. Actuators. A Phys., 2005, vol. 119, No. 2, pp. 476-488.

* cited by examiner

REPULSIVE-ATTRACTIVE-FORCE ELECTROSTATIC ACTUATOR

CROSS-REFERENCE TO RELATED APPLICATIONS

This application claims priority to U.S. Provisional Application No. 62/654,067 filed Apr. 6, 2018, the entire content of which is hereby incorporated by reference.

FEDERAL FUNDING

This invention was made with government support under Grant Number CMMI-1427096 awarded by the National Science Foundation. The government has certain rights in the invention.

BACKGROUND

1. Technical Field

The field of the currently claimed embodiments of this invention relates to electrostatic actuators and products that incorporate the actuators, and more particularly to repulsive-attractive-force electrostatic actuators and products that incorporate the repulsive-attractive-force electrostatic actuators.

2. Discussion of Related Art

Electrostatic actuators typically consist of sets of moveable electrodes, e.g., conductive plates or combs, separated by an insulating dielectric with electrostatic forces proportional to the charge accumulation on and electric fields between electrodes due to an applied electric potential. In repulsive-force electrostatic actuators, the moveable electrodes repel each other, while in attractive-force electrostatic actuators, the moveable electrodes attract each other. However, conventional repulsive-force actuators have numerous problems, including shorting between electrodes within a layer as well as possible shorting of electrodes between layers. In addition, it can often be useful to have actuators that can controllably generate both repulsive and attractive forces between the movable electrodes. Therefore, there remains a need for improved electrostatic actuators.

SUMMARY

A repulsive-attractive-force electrostatic actuator according to some embodiments of the invention includes a first actuator layer including a first substrate of a first dielectric material having a transverse thickness and two opposing surfaces, a first electrode pattern at least one of attached to or formed on one of the two opposing surfaces of the first substrate, and a second electrode pattern at least one of attached to or formed on the other one of the two opposing surfaces of the first substrate so as to be on an opposing side with respect to the first electrode pattern. The first and second electrode patterns are substantially aligned with each other in a direction of the transverse thickness on the two opposing surfaces of the first substrate. The repulsive-attractive-force electrostatic actuator further includes a second actuator layer spaced apart from the first actuator layer in the direction of the transverse thickness, with at least one of a vacuum, air, a gas or a dielectric material therebetween. The second actuator layer includes a second substrate of a second dielectric material having a transverse thickness and two opposing surfaces, a third electrode pattern at least one of attached to or formed on one of the two opposing surfaces of the second substrate, and a fourth electrode pattern at least one of attached to or formed on the other one of the two opposing surfaces of the second substrate so as to be on an opposing side with respect to the third electrode pattern. The third and fourth electrode patterns are substantially aligned with each other in a direction of the transverse thickness on the two opposing surfaces of the second substrate.

The repulsive-attractive-force electrostatic actuator further includes a first voltage source connected to the first and second electrode patterns such that, during operation, each is entirely at a common voltage across the corresponding electrode pattern, the first electrode pattern is at a relative voltage of $V_1$ to the second electrode pattern. The repulsive-attractive-force electrostatic actuator further includes a second voltage source connected to the third and fourth electrode patterns such that, during operation, each is entirely at a common voltage across the corresponding electrode pattern, the third electrode pattern is at a relative voltage of $V_2$ to the fourth electrode pattern.

The repulsive-attractive-force electrostatic actuator further includes an actuator frame connected to the first and second actuator layers such that at least a portion of at least one of the first and second actuator layers is movable due to an applied voltage to effect motion to an object at least one of attached to or in mechanical connection to the repulsive-attractive-force electrostatic actuator when in operation. The first and second voltage sources have a common ground, and the applied relative voltages $V_1$ and $V_2$ are selectable to provide one of a selected repulsive force or a selected attractive force between the first and second actuator layers.

A multi-substrate repulsive-attractive-force electrostatic actuator according to some embodiments of the invention includes a first actuator layer including a first substrate of a first dielectric material having a transverse thickness and two opposing surfaces, a first electrode pattern at least one of attached to or formed on one of the two opposing surfaces of the first substrate, and a second electrode pattern at least one of attached to or formed on the other one of the two opposing surfaces of the first substrate so as to be on an opposing side with respect to the first electrode pattern. The first and second electrode patterns are substantially aligned with each other in a direction of the transverse thickness on the two opposing surfaces of the first substrate. The first actuator layer further includes a second substrate of a second dielectric material having a transverse thickness and two opposing surfaces, at least one of attached to or formed on the other one of the two opposing surfaces of the second electrode pattern so as to be on an opposing side with respect to the first substrate, and a third electrode pattern at least one of attached to or formed on the other one of the two opposing surfaces of the second substrate so as to be on an opposing side with respect to the second electrode pattern.

The multi-substrate repulsive-attractive-force electrostatic actuator further includes a first voltage source connected to the first and second electrode patterns such that, during operation, each is entirely at a common voltage across the corresponding electrode pattern, the first electrode pattern is at a relative voltage of $V_1$ to the second electrode pattern. The multi-substrate repulsive-attractive-force electrostatic actuator further includes a second voltage source connected to the second and third electrode patterns such that, during operation, each is entirely at a common voltage across the corresponding electrode pattern, the second electrode pattern is at a relative voltage of $V_2$ to the third electrode pattern.

The multi-substrate repulsive-attractive-force electrostatic actuator further includes a second actuator layer spaced apart from the first actuator layer with at least one of a vacuum, air, a gas or a dielectric material therebetween. The second actuator layer includes a third substrate of a third dielectric material having a transverse thickness and two opposing surfaces, a fourth electrode pattern at least one of attached to or formed on one of the two opposing surfaces of the third substrate, and a fifth electrode pattern at least one of attached to or formed on the other one of the two opposing surfaces of the third substrate so as to be on an opposing side with respect to the fourth electrode pattern. The fourth and fifth electrode patterns are substantially aligned with each other in a direction of the transverse thickness on the two opposing surfaces of the third substrate.

The second actuator layer further includes a fourth substrate of a fourth dielectric material having a transverse thickness and two opposing surfaces, at least one of attached to or formed on the other one of the two opposing surfaces of the fifth electrode pattern so as to be on an opposing side with respect to the third substrate, and a sixth electrode pattern at least one of attached to or formed on the other one of the two opposing surfaces of the fourth substrate so as to be on an opposing side with respect to the fifth electrode pattern.

The multi-substrate repulsive-attractive-force electrostatic actuator further includes a third voltage source connected to the fourth and fifth electrode patterns such that, during operation, each is entirely at a common voltage across the corresponding electrode pattern, the fourth electrode pattern is at a relative voltage of $V_3$ to the fifth electrode pattern. The multi-substrate repulsive-attractive-force electrostatic actuator further includes a fourth voltage source connected to the fifth and sixth electrode patterns such that, during operation, each is entirely at a common voltage across the corresponding electrode pattern, the fifth electrode pattern is at a relative voltage of $V_4$ to the sixth electrode pattern.

BRIEF DESCRIPTION OF THE DRAWINGS

Further objectives and advantages will become apparent from a consideration of the description, drawings, and examples.

DETAILED DESCRIPTION

Figure 1A:
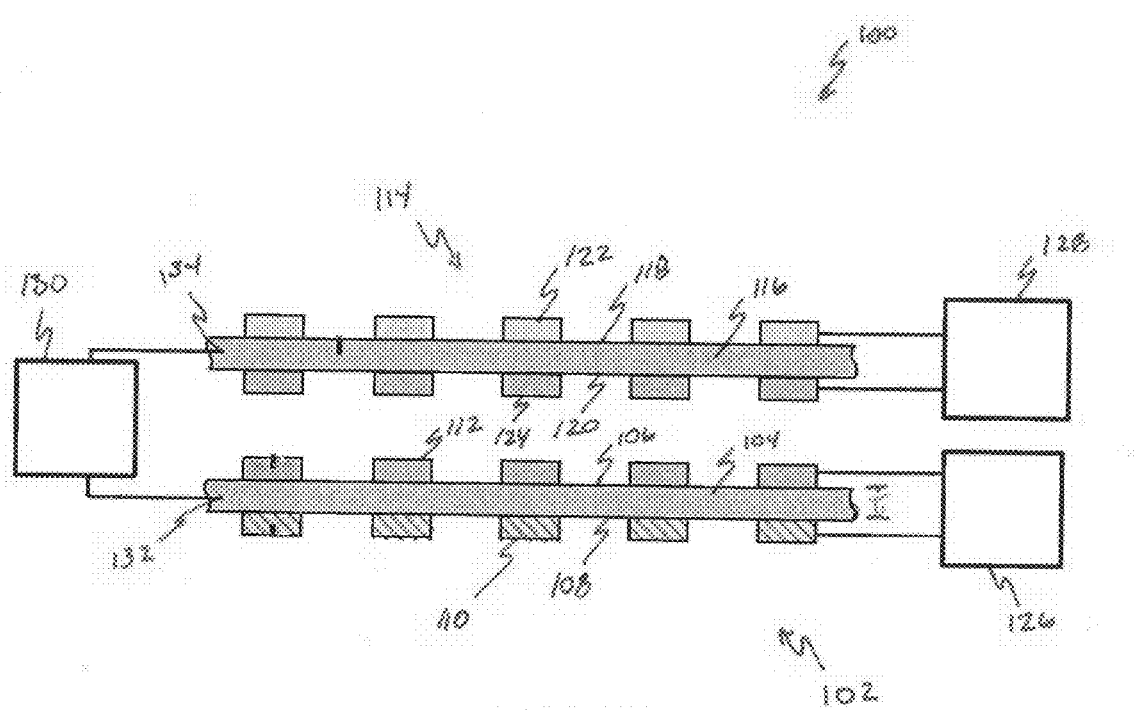
FIG. 1A is a schematic illustration of a repulsive-attractive-force electrostatic actuator (RAFA) according to some embodiments of the invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The term "air" is intended to cover ordinary atmospheric environments such that it can include a mixture of atmospheric gases as well as possibly containing some suspensions of particles and/or liquid droplets.

The term "gas" is intended to include either chemically pure gas types and/or mixtures of chemically pure gas types.

An embodiment of the current invention is a planar electrostatic actuator, which uses a novel electrode pattern and a plurality of applied voltages to selectively generate repulsive and attractive forces. (U.S. Non-Provisional application Ser. No. 16/250,522 by the same inventors and assigned to the same assignee as the current application, filed Jan. 17, 2019, is hereby incorporated in its entirety.) The actuator according to an embodiment of the invention is able to generate both repulsive and attractive forces with the same electrodes, instead of just repulsive forces, and to control the magnitude of force using two or more applied electrical signals, i.e., voltages instead of just one signal in the above-noted non-provisional patent application. In some embodiments, the same or similar electrode patterns described in U.S. Non-Provisional application Ser. No. 16/250,522 can be used.

In the repulsive mode, adjacent electrodes (on the same layer) and opposing electrodes (on adjacent layers) can be at the same potential, which allows greatly increased electric field strength. Unlike previous repulsive-force electrostatic actuators, the device in repulsive mode does not short if these adjacent or opposing electrodes are brought in contact.

In some embodiments, the actuator array can be printed over large areas at low cost to make visual displays or sound walls, for example. It is also of interest to the micro-electromechanical systems (MEMS) community, which relies almost exclusively on attractive-force actuators at this time for powering their devices.

Some embodiments can provide large actuator arrays for signs, large actuator arrays for building shading, large actuator arrays for synthetic sound sources, noise-cancelling walls, and actuator arrays for biological tissue growth control. Some embodiments can also provide large actuator arrays for controlling air or fluid flow over or around aerodynamic bodies, buildings, and other structures. In principle, some embodiments can be scaled up to higher stress, low-cost, light-weight artificial muscles.

Some embodiments can be operated at high temperatures when fabricated using appropriate high melting point materials. Some embodiments can be operated at extremely low temperatures when fabricated with appropriate cold-tolerant materials.

An embodiment of the current invention is directed to a novel bidirectional repulsive-attractive-force electrostatic actuator (RAFA). Actuators according to some embodiments of the current invention can generate both repulsive and attractive forces with the same electrodes, instead of just repulsive forces, and can allow a user to control the magnitude and direction of force using two or more applied electrical voltage signals instead of just one signal as in the above-mentioned non-provisional patent application.

FIG. 1 is a schematic illustration of a repulsive-attractive-force electrostatic actuator according to some embodiments of the invention. The repulsive-attractive-force electrostatic actuator 100 includes a first actuator layer 102 including a first substrate 104 of a first dielectric material having a transverse thickness $T_1$ and two opposing surfaces 106, 108. The first actuator layer 102 includes a first electrode pattern 110 at least one of attached to or formed on one of the two opposing surfaces 106, 108 of the first substrate 104, and a second electrode pattern 112 at least one of attached to or formed on the other one of the two opposing surfaces 106, 108 of the first substrate 104 so as to be on an opposing side with respect to the first electrode pattern 110. The first and second electrode patterns 110, 112 are substantially aligned with each other in a direction of the transverse thickness on the two opposing surfaces 106, 108 of the first substrate.

The repulsive-attractive-force electrostatic actuator 100 includes a second actuator layer 114 spaced apart from the first actuator layer 102 in the direction of the transverse thickness $T_1$, with at least one of a vacuum, air, a gas or a dielectric material therebetween. The second actuator layer 114 includes a second substrate 116 of a second dielectric material having a transverse thickness and two opposing surfaces 118, 120. The second actuator layer 114 includes a third electrode pattern 122 at least one of attached to or formed on one of the two opposing surfaces 118, 120 of the second substrate 116, and a fourth electrode pattern 124 at least one of attached to or formed on the other one of the two opposing surfaces 118, 120 of the second substrate 116 so as to be on an opposing side with respect to the third electrode pattern 122. The third and fourth electrode patterns 122, 124 are substantially aligned with each other in a direction of the transverse thickness on the two opposing surfaces of the second substrate 116. According to some embodiments, the first and second actuator layers 102, 114, including the electrode patterns within each layer, are substantially aligned with respect to each other in a direction of the transverse thickness of the two opposing surfaces of each actuator layer.

The repulsive-attractive-force electrostatic actuator 100 further includes a first voltage source 126 connected to the first and second electrode patterns 110, 112 such that, during operation, each is entirely at a common voltage across the corresponding electrode pattern, the first electrode pattern 110 is at a relative voltage of $V_1$ to the second electrode pattern 112. The repulsive-attractive-force electrostatic actuator 100 further includes a second voltage source 128 connected to the third and fourth electrode patterns 122, 124 such that, during operation, each is entirely at a common voltage across the corresponding electrode pattern, the third electrode pattern 122 is at a relative voltage of $V_2$ to the fourth electrode pattern 124. The repulsive-attractive-force electrostatic actuator 100 further includes an actuator frame 130 connected to the first and second actuator layers 102, 114 such that at least a portion of at least one of the first and second actuator layers 102, 114 is movable due to an applied voltage to effect motion or apply force to an object at least one of attached to or in mechanical connection to the repulsive-attractive-force electrostatic actuator when in operation. The applied relative voltages $V_1$ and $V_2$ are selectable to provide one of a selected repulsive force or a selected attractive force between the first and second actuator layers 102, 114. According to some embodiments, the first and second voltage sources 126, 128 have a common ground.

According to some embodiments, the first and second substrates 104, 116 are each at least one of a thin film or a sheet of a first dielectric material and a second dielectric material, respectively. According to some embodiments, the first and second dielectric materials are each selected from at least one of a polyimide or biaxially-oriented polyethylene terephthalate. According to some embodiments, the first and second dielectric materials are the same dielectric material. According to some embodiments, the first and second dielectric materials are each selected from at least one of a high dielectric strength polymer or polymer composite. According to some embodiments, the first and second dielectric materials comprise at least one of polypropylene, polyethylene, polyimide, polytetrafluorethylene, glass fiber epoxy composite, or cellulose. According to some embodiments, the first and second dielectric materials are both poly(4,4'-oxydiphenylene-pyromellitimide). According to some embodiments, the first and second dielectric materials comprise at least one of a thin-film sheet of glass, $SiO_2$, mica, $Si_3N_4$ or other thin-film dielectric materials that may or may not be polymers, ceramics, or other non-crystalline solids.

According to some embodiments, the first, second, third, and fourth electrode patterns 110, 112, 122, 124 are each at least one of a thin film or a sheet of a first, second, third, and fourth conductive material, respectively. According to some embodiments, the first, second, third, and fourth conductive materials are each selected from at least one of a metal, metal alloy, metallic glass, metallic nanowires, ceramic, polymer, epoxy, paste, ink, carbon nanotubes, or other organic compound.

According to some embodiments, the actuator frame 130 is connected to the first and second actuator layers 102, 114 such that at least one portion of each actuator layer, for example, an edge of layer 102, is held relatively fixed to at least one portion of an opposite layer, for example, an edge of layer 114, and the remaining portion of one or all of the actuator layers are free to move with a cantilever motion. According to some embodiments, the actuator frame 130 is connected to the first and second actuator layers 102, 114 such that at least one of the first and second actuator layers 102, 114 moves in a direction substantially orthogonal to the two opposing surfaces of the first and second substrates 104, 116 to provide substantially translational motion in operation while the first and second substrates 104, 116 remain substantially parallel to each other.

Figure 1B:
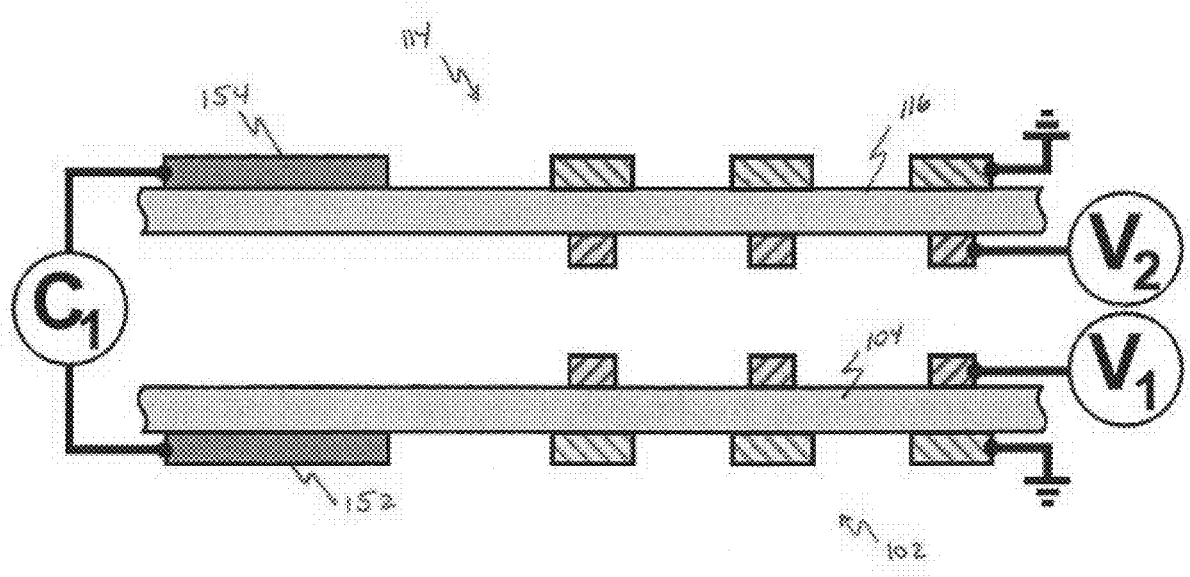
FIG. 1B is a schematic illustration of a RAFA including a parallel plate capacitive sensor according to some embodiments of the invention.

A repulsive-attractive-force electrostatic actuator according to some embodiments is shown in FIG. 1B. In addition to the features shown in FIG. 1A, the repulsive-attractive-force electrostatic actuator includes a fifth electrode pattern 152 attached to the first substrate 104 and a sixth electrode pattern 154 attached to the second substrate 116, to form a parallel plate capacitive sensor ($C_1$). Such a sensor would have a capacitance between the fifth and sixth electrodes 152, 154 that provides a measure of the relative displacement between the first and second substrates 104, 116. Capacitance measurement is a common form of sensing and would use the same electrode manufacturing process as the RAFA electrodes. The only difference is that a single capacitive sensing electrode pattern is attached to or formed on the substrate of each of the actuator layers, whereas the RAFA electrodes have two electrodes per actuator layer, one on each side of the layer's dielectric substrate.

According to some embodiments, the first and second voltage sources 126, 128 are high-voltage sources each capable of providing a voltage of at least 1 kV. According to some embodiments, the first and second voltage sources 126, 128 are high-voltage sources each capable of providing a voltage of between 1 kV to 5 kV.

Figure 1C:
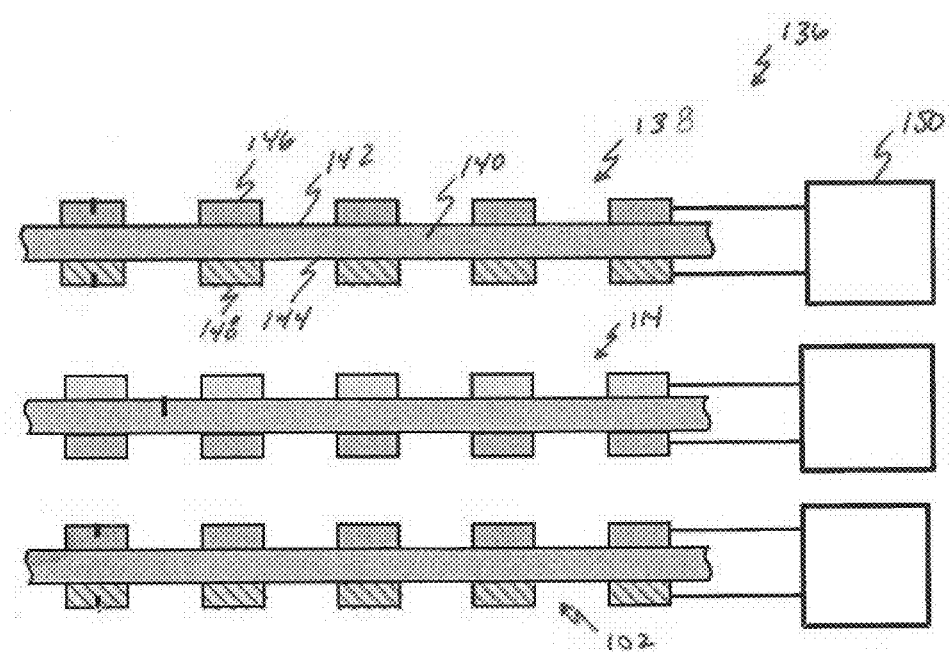
FIG. 1C is a schematic illustration of multi-layer repulsive-attractive-force electrostatic actuator according to some embodiments of the invention.

FIG. 1C is a schematic illustration of a repulsive-attractive-force electrostatic actuator according to some embodiments. The repulsive-attractive-force electrostatic actuator according to this embodiment may be referred to herein as a "multi-layer repulsive-attractive-force electrostatic actuator," because it includes three or more actuator layers. In addition to the features of the repulsive-attractive-force electrostatic actuator 100 of FIG. 1A, the multi-layer repulsive-attractive-force electrostatic actuator 136 includes a third actuator layer 138 spaced apart from the first and second actuator layers 102, 114 in the direction of each layer's transverse thickness, with at least one of a vacuum, air, a gas or a dielectric material therebetween. The third actuator layer 138 includes a third substrate 140 of a third dielectric material having a transverse thickness and two opposing surfaces 142, 144. The third actuator layer 138 includes a fifth electrode pattern 146 at least one of attached to or formed on one of the two opposing surfaces 142, 144 of the third substrate 140, and a sixth electrode pattern 148 at least one of attached to or formed on the other one of the two opposing surfaces 142, 144 of the third substrate 140 so as to be on an opposing side with respect to the fifth electrode pattern 146. The fifth and sixth electrode patterns 146, 148 are substantially aligned with each other in a direction of the transverse thickness on the two opposing surfaces 142, 144 of the third substrate 140. According to some embodiments, the first, second, and third actuator layers 102, 114, 138 including the electrode patterns within each layer, are substantially aligned with respect to each other in a direction of the transverse thickness of the two opposing surfaces of each actuator layer.

The multi-layer repulsive-attractive-force electrostatic actuator 136 further includes a third voltage source 150 connected to the fifth and sixth electrode patterns 146, 148 such that, during operation, each is entirely at a common voltage across the corresponding electrode pattern, the fifth electrode pattern 146 is at an opposite voltage relative to the sixth electrode pattern 148 having a relative voltage of $V_3$. The first, second and third voltage sources have a common ground, and the applied relative voltages $V_1$, $V_2$ and $V_3$ are selectable to provide one of a selected repulsive force or a selected attractive force between adjacent pairs of the first, second and third actuator layers.

The multi-layer repulsive-attractive-force electrostatic actuator can further include any number of additional actuator layers with corresponding substrates, electrode patterns, and voltage sources. The resulting multi-layer assembly of repulsive-attractive-force electrostatic actuator layers can have all applied relative voltages selectable to provide one of a selected repulsive force or a selected attractive force between the adjacent actuator layers. According to some embodiments, all actuator layers, including the electrode patterns within each layer, are substantially aligned with respect to each other in a direction of the transverse thickness of the two opposing surfaces of each actuator layer.

According to some embodiments, a steerable optical component includes an optical component attached to an assembly which allows motion in at least one degree of freedom, and a repulsive-attractive-force electrostatic actuator arranged in mechanical connection with the optical component. According to some embodiments, a surface coating comprising a plurality of repulsive-attractive-force electrostatic actuators arranged in an array to control interaction of at least one of a fluid or electromagnetic radiation interactions with a surface coated therewith. According to some embodiments, a robotic device includes a plurality of repulsive-attractive-force electrostatic actuators arranged to effect motion of the robotic device. According to some embodiments, a biological cell growth device includes a plurality of repulsive-attractive-force electrostatic actuators arranged to effect motion of biological cells being grown or maintain therein.

Figure 4:
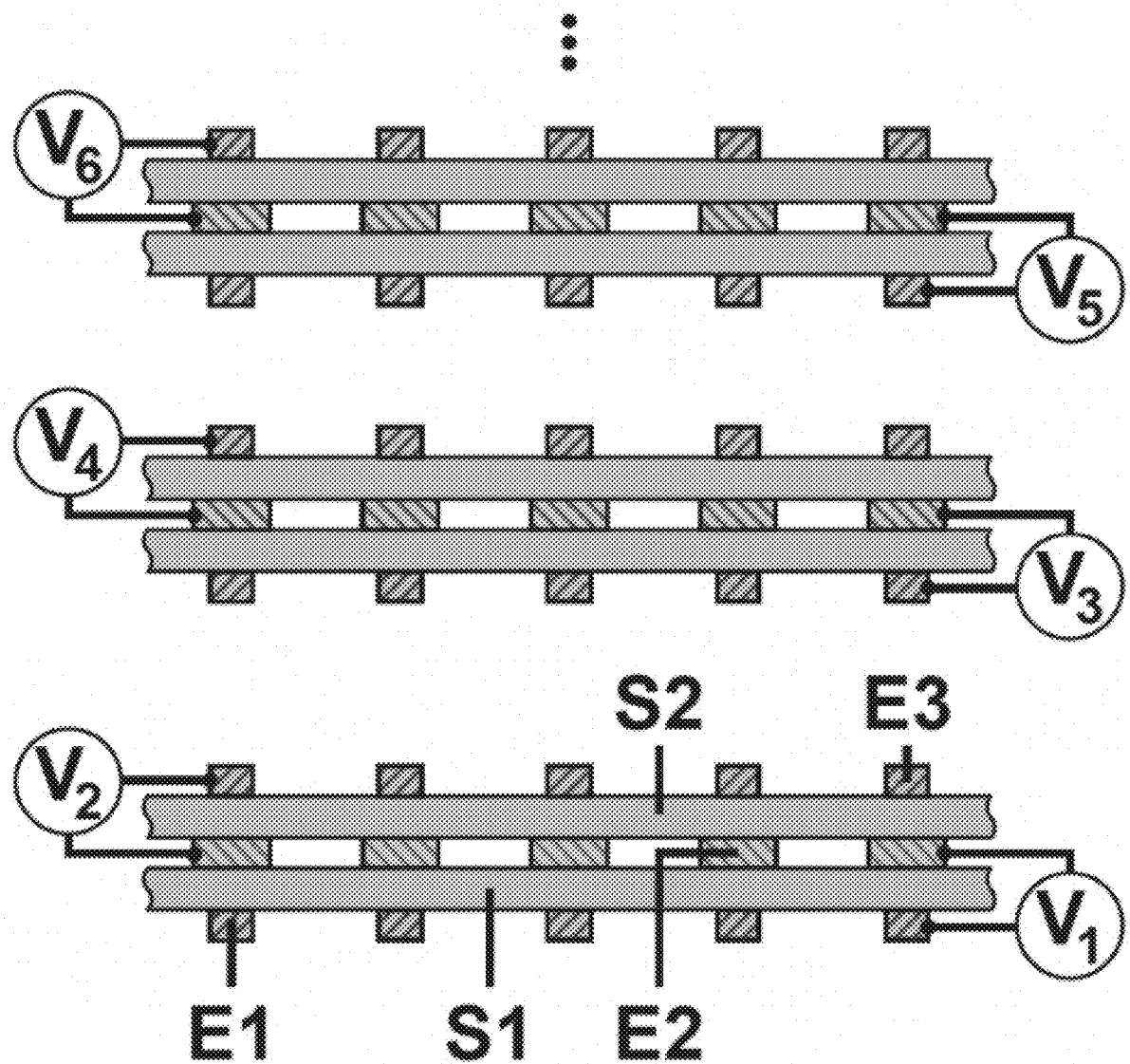
FIG. 4 is a schematic illustration of a multi-layer, multi-substrate repulsive-attractive-force electrostatic actuator according to another embodiment of the current invention.

A multi-layer, multi-substrate repulsive-attractive-force electrostatic actuator according to some embodiments is shown in FIG. 4. The term "multi-substrate repulsive-attractive-force electrostatic actuator" refers to a repulsive-attractive-force electrostatic actuator having an actuator layer that includes at least two substrates. The term "multi-layer, multi-substrate repulsive-attractive-force electrostatic actuator" refers to a repulsive-attractive-force electrostatic actuator having three or more actuator layers, wherein at least three of the actuator layers include at least two substrates.

A multi-substrate repulsive-attractive-force electrostatic actuator includes a first actuator layer including a first substrate S1 of a first dielectric material having a transverse thickness and two opposing surfaces, a first electrode pattern E1 at least one of attached to or formed on one of the two opposing surfaces of the first substrate S1, and a second electrode pattern E2 at least one of attached to or formed on the other one of the two opposing surfaces of the first substrate S1 so as to be on an opposing side with respect to the first electrode pattern E1. The first and second electrode patterns are substantially aligned with each other in a direction of the transverse thickness on the two opposing surfaces of the first substrate S1.

The first actuator layer further includes a second substrate S2 of a second dielectric material having a transverse thickness and two opposing surfaces, at least one of attached to or formed on the other one of the two opposing surfaces of the second electrode pattern E2 so as to be on an opposing side with respect to the first substrate S1, and a third electrode pattern E3 at least one of attached to or formed on the other one of the two opposing surfaces of the second substrate S2 so as to be on an opposing side with respect to the second electrode pattern E2. The second and third electrode patterns are substantially aligned with each other in a direction of the transverse thickness on the two opposing surfaces of the second substrate S1.

A first voltage source $V_1$ is connected to the first and second electrode patterns such that, during operation, each is entirely at a common voltage across the corresponding electrode pattern, the first electrode pattern is at a relative voltage of $V_1$ to the second electrode pattern. A second voltage source $V_2$ is connected to the second and third electrode patterns such that, during operation, each is entirely at a common voltage across the corresponding electrode pattern, the second electrode pattern is at a relative voltage of $V_2$ to the third electrode pattern.

The multi-substrate repulsive-attractive-force electrostatic actuator includes a second actuator layer spaced apart from the first actuator layer with at least one of a vacuum, air, a gas or a dielectric material therebetween, the second actuator layer including a third substrate of a third dielectric material having a transverse thickness and two opposing surfaces, a fourth electrode pattern at least one of attached to or formed on one of the two opposing surfaces of the third substrate, and a fifth electrode pattern at least one of attached to or formed on the other one of the two opposing surfaces of the third substrate so as to be on an opposing side with respect to the fourth electrode pattern. The fourth and fifth electrode patterns are substantially aligned with each other in a direction of the transverse thickness on the two opposing surfaces of the third substrate.

The second actuator layer includes a fourth substrate of a fourth dielectric material having a transverse thickness and two opposing surfaces, at least one of attached to or formed on the other one of the two opposing surfaces of the fifth electrode pattern so as to be on an opposing side with respect to the third substrate, and a sixth electrode pattern at least one of attached to or formed on the other one of the two opposing surfaces of the fourth substrate so as to be on an opposing side with respect to the fifth electrode pattern. The fifth and sixth electrode patterns are substantially aligned with each other in a direction of the transverse thickness on the two opposing surfaces of the fourth substrate. A third voltage source $V_3$ connected to the fourth and fifth electrode patterns such that, during operation, each is entirely at a common voltage across the corresponding electrode pattern, the fourth electrode pattern is at a relative voltage of $V_3$ to the fifth electrode pattern. A fourth voltage source $V_4$ is connected to the fifth and sixth electrode patterns such that, during operation, each is entirely at a common voltage across the corresponding electrode pattern, the fifth electrode pattern is at a relative voltage of $V_4$ to the sixth electrode pattern. The applied relative voltages $V_1$, $V_2$, $V_3$, and $V_4$ are selectable to provide one of a selected repulsive force or a selected attractive force between said first and second actuator layers. According to some embodiments, both actuator layers, including the electrode patterns within each layer, are substantially aligned with respect to each other in a direction of the transverse thickness of the two opposing surfaces of each actuator layer substrate.

The multi-layer, multi-substrate repulsive-attractive-force electrostatic actuator further includes a third actuator layer spaced apart from the second actuator layer with at least one of a vacuum, air, a gas or a dielectric material therebetween, the third actuator layer including a fifth substrate of a fifth dielectric material having a transverse thickness and two opposing surfaces, a seventh electrode pattern at least one of attached to or formed on one of the two opposing surfaces of the fifth substrate, and an eighth electrode pattern at least one of attached to or formed on the other one of the two opposing surfaces of the fifth substrate so as to be on an opposing side with respect to the seventh electrode pattern. The seventh and eighth electrode patterns are substantially aligned with each other in a direction of the transverse thickness on the two opposing surfaces of the fifth substrate.

The third actuator layer includes a sixth substrate of a sixth dielectric material having a transverse thickness and two opposing surfaces, at least one of attached to or formed on the other one of the two opposing surfaces of the eighth electrode pattern so as to be on an opposing side with respect to the fifth substrate, and a ninth electrode pattern at least one of attached to or formed on the other one of the two opposing surfaces of the sixth substrate so as to be on an opposing side with respect to the eighth electrode pattern. The eighth and ninth electrode patterns are substantially aligned with each other in a direction of the transverse thickness on the two opposing surfaces of the sixth substrate.

A fifth voltage source $V_5$ is connected to the seventh and eighth electrode patterns such that, during operation, each is entirely at a common voltage across the corresponding electrode pattern, the seventh electrode pattern is at a relative voltage of $V_5$ to the eighth electrode pattern. A sixth voltage source $V_6$ is connected to the eighth and ninth electrode patterns such that, during operation, each is entirely at a common voltage across the corresponding electrode pattern, the eighth electrode pattern is at a relative voltage of $V_6$ to the ninth electrode pattern. The applied relative voltages $V_1$, $V_2$, $V_3$, $V_4$, $V_5$ and $V_6$ are selectable to provide one of a selected repulsive force or a selected attractive force between the first and second actuator layers and between the second and third actuator layers. According to some embodiments, all three actuator layers, including the electrode patterns within each layer, are substantially aligned with respect to each other in a direction of the transverse thickness of the two opposing surfaces of each actuator layer substrate.

The multi-layer, multi-substrate repulsive-attractive-force electrostatic actuator can further include any number of additional multi-substrate actuator layers with corresponding substrates, electrode patterns, and voltage sources. The resulting multi-layer assembly of multi-substrate repulsive-attractive-force electrostatic actuator layers will have all applied relative voltages selectable to provide one of a selected repulsive force or a selected attractive force between the adjacent actuator layers. According to some embodiments, all actuator layers, including the electrode patterns within each layer, are substantially aligned with respect to each other in a direction of the transverse thickness of the two opposing surfaces of each actuator layer substrate.

Figure 2:
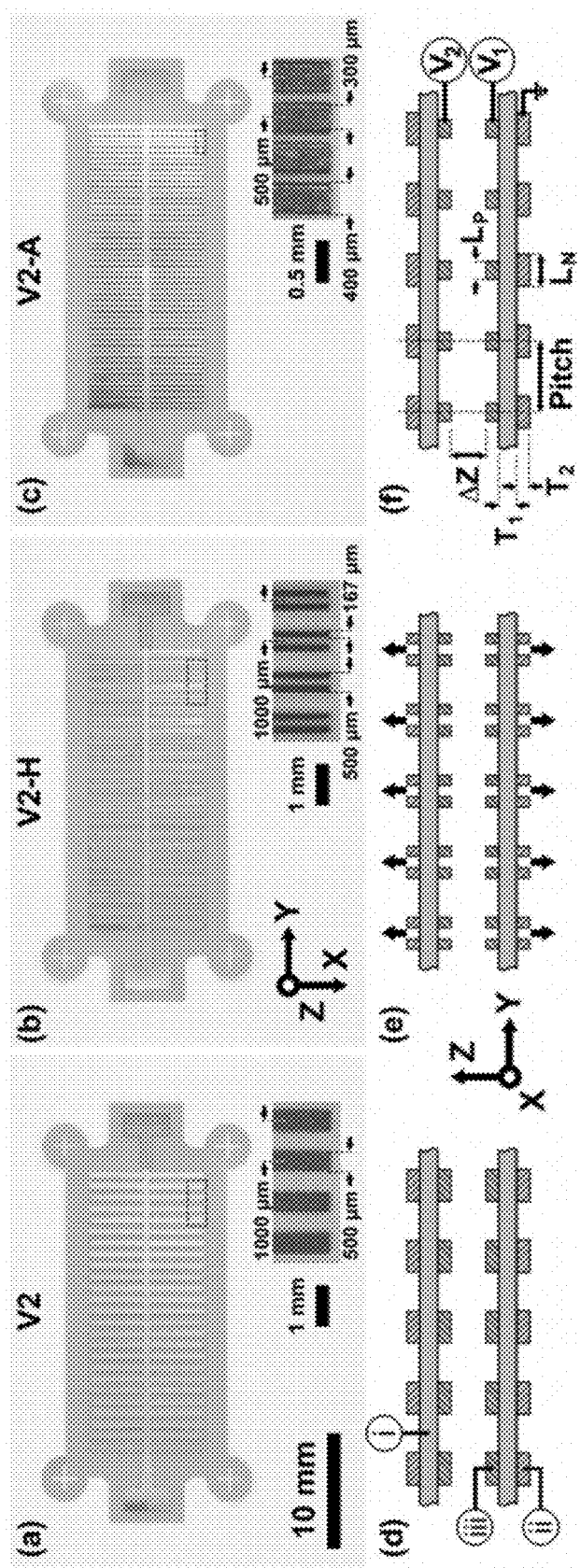
FIG. 2 shows possible electrode patterns (a-c), termed V2, V2-H, and V2-A, according to some embodiments of the invention, all of which can be employed to produce a RAFA; cross sections of each design are also shown (d-f). (d) The layers include an insulating substrate (i), which supports conductive electrodes (ii-iii). (e-f) The layers experience a net repulsive force or net attractive force, depending on the applied voltages ($V_1/V_2$). (f) Note that each layer is applied a different voltage ($V_1/V_2$) on the positive electrodes (iii) while all neutral electrodes (ii) are tied to common ground, and that all electrodes on one side of each layer are the same electrical potential.
Figure 3:
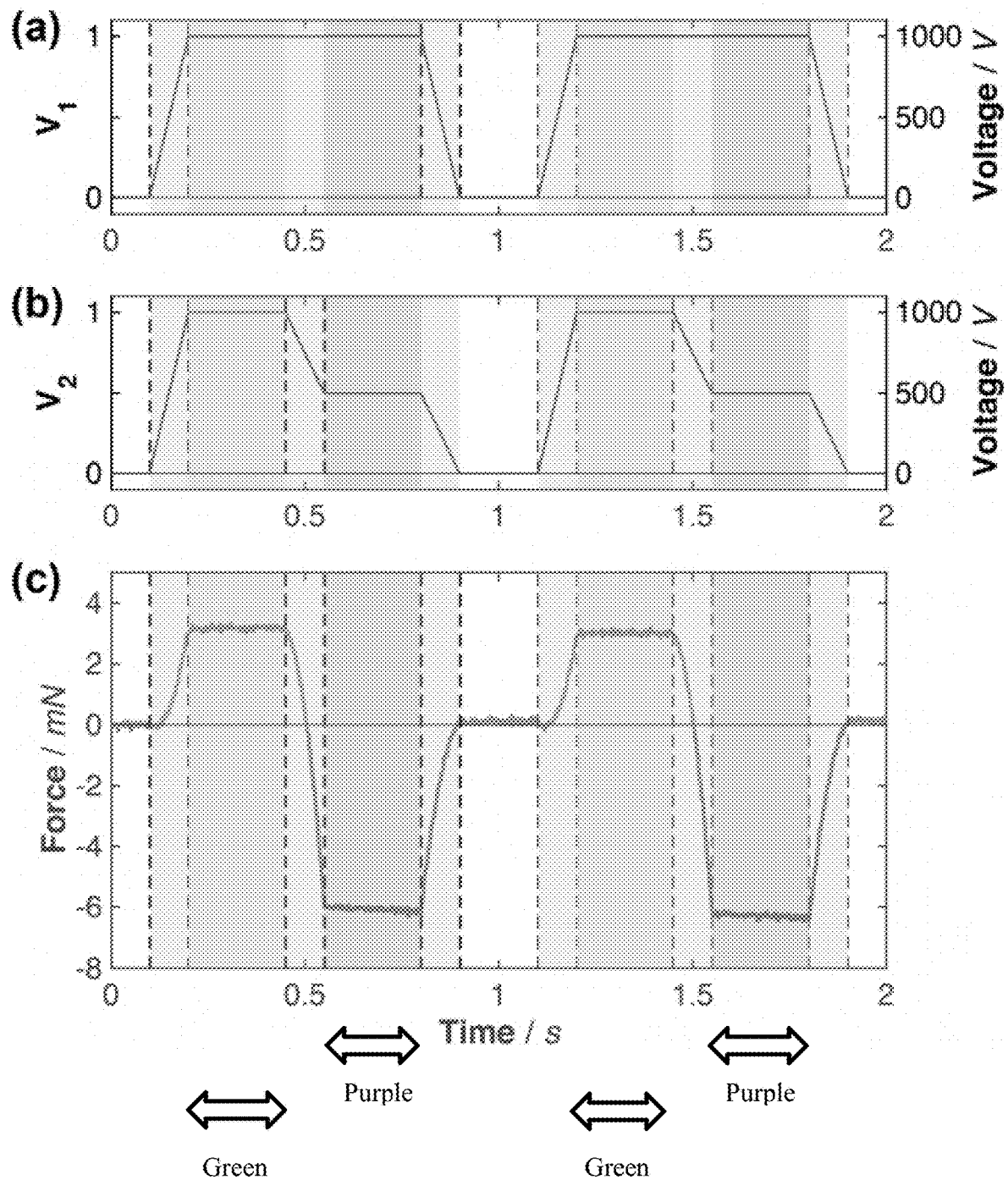
FIG. 3 shows control signals for $V_1$ (a) and $V_2$ (b), and the resulting bidirectional force (c) generated by a 2-layer RAFA with $\Delta Z=100$ μm and 0-1.0 kV. The top two panels show the commanded $V_1$ (a) and $V_2$ (b) trapezoidal signals along with measured applied voltage. (c) Measured force versus time. In (a/b), green regions represent voltage signals designed for repulsion and purple regions represent those for attraction. In (c), measured repulsive forces are green and attractive forces are purple.

Some novel electrode configurations according to some embodiments of the current invention are shown in FIG. 2, along with sample fabricated actuator layers. Performance of a fabricated actuator generating both repulsive and attractive forces according to an embodiment of the current invention is shown in FIG. 3.

While we demonstrate the first instance of fabricating a cm-scale RAFA using planar (thin-film) substrates according to an embodiment of the current invention, MEMS-scale actuators are also possible with conventional MEMS manufacturing processes according to further embodiments of the current invention. Finally, we demonstrate out-of-plane actuation at the cm-scale, but in-plane actuation is also feasible for MEMS-scale actuators according to various embodiments of the current invention.

This actuator electrode configuration is a pattern that has not been developed before and translates to simple, cheap fabrication processes for physical actuators. The actuator array can be printed over large areas at low cost to make visual displays or sound walls. It is also of interest to the MEMS community, which relies almost exclusively on attractive-force actuators at this time for powering their devices.

This actuator electrode configuration can be employed anywhere that requires a small or low-force actuator, and can enable a number of special uses:
  Bidirectional MEMS actuators
  Flexible actuators
  Printed actuators (on rigid or flexible substrates)
  Large arrays of actuators (wall of independently controlled actuators, large-area flexible display with many individual actuators, etc.)
  Large-area actuators (via large sheets printed with a single electrode)
  Custom shape actuators (electrodes can fill a polygonal- or irregularly-shaped region, so long as the electrode cross-sections locally mirror each other, as shown in FIG. 1A, for example)
  Micro-mirror positioners (for beam-steering of a laser)
  Tissue engineering and smart petri-dishes (for cell-scale forces and manipulation)

In the repulsive mode, this actuator electrode configuration can enable a number of significant advantages over other repulsive-force actuators. For example, the actuator can withstand extremely high field strength/high voltage operation without insulator coatings or air breakdown (shorting), limited only by the dielectric strength of the substrate. The actuator electrode confirmation has minimal failure modes, because only electrodes of the same electric potential can touch each other. Shorting is prevented by a strong, stiff insulator between opposite polarity electrodes. The insulator will not thin, and therefore prevents these electrodes from moving too close together, as in dielectric elastomer actuators (DEAs).

The repulsive actuator capability minimizes the likelihood of stiction/pull-in failure (as seen in attractive-force electrostatic actuators). Peak repulsive force occurs at the position where the electrodes are closest. This is an inherently stable position. The actuator can have a multi-layer structure, where layers are stacked to increase actuator displacement, without increasing the risk of shorting between layers. The actuator can be made from multiple materials, including a variety of conductors (copper film, conductive ink, etc.) on any printable or laminatible substrate. Flexible actuators can be made by printing thin metal electrodes on flexible substrates. In some embodiments, a MEMS actuator is made of metal and silicon, and is very rigid.

The actuator can be fabricated by bulk-fabrication techniques. Actuator layers can be mass-produced at very low cost with standard industry processes, like ink printing (roll-to-roll or screen printing with conductive ink) and PCB manufacturing (etch copper traces on flex-circuit/printed circuit boards). Existing repulsive actuators need cleanroom manufacturing, which is prohibitive for mass production. The actuator according to some embodiments produces greater forces and displacements than MEMS-fabricated repulsive-force electrostatic actuators. Alignment of the actuator layers may be achieved by visually aligning features or pins/sockets, etc., and therefore can be easily accomplished.

FIG. 4 is a schematic illustration of a multi-layer, multi-substrate repulsive-attractive-force electrostatic actuator according to another embodiment of the current invention. Three actuator layers are illustrated in this example, but there could be two layers or more than two according to other embodiments. Also, the frame structure is not shown in this case which can be similar or the same as with the other embodiments and can take many forms depending on the application. The $V_1$-$V_6$ voltages shown here can be either positive or negative, depending on if the middle electrode layers are held to a common ground or common high voltages. Both are possible.

EXAMPLES

The following describes some concepts of the current invention with reference to particular embodiments. The general concepts of the current invention are not limited to the examples described.

An array of novel m- to cm-scale actuation technologies have enabled the proliferation of mobile meso-scale robots in recent years.

Numerous mm- to cm-scale robots employ electrostatic actuators: a multi-phase electrostatic film motor with electroadhesion, an oscillating electrostatic film actuator inducing robot body vibrations, paper zipper actuators with anisotropic friction feet, and scratch drive actuators providing inchworm locomotion. All use attractive-force electrostatic actuators, and most are tethered. Electrostatic actuators operate with few moving parts, simple control signals, and forces proportional to applied voltages.

Other meso-scale robots are powered by piezoelectric actuators—flying insect, myriapod, HAMR-V/F, LPMR—by shape memory alloy actuators—RoACH, MEDIC, HAMR—and by magnetic actuators. Finally, vibration-induced ambulation of robots has been achieved in a silicon hexapod (via substrate excitation), Resbot (using electromagnetic motors), and the previously mentioned electrostatic- and piezoelectric-actuator powered robots.

Figure 5:
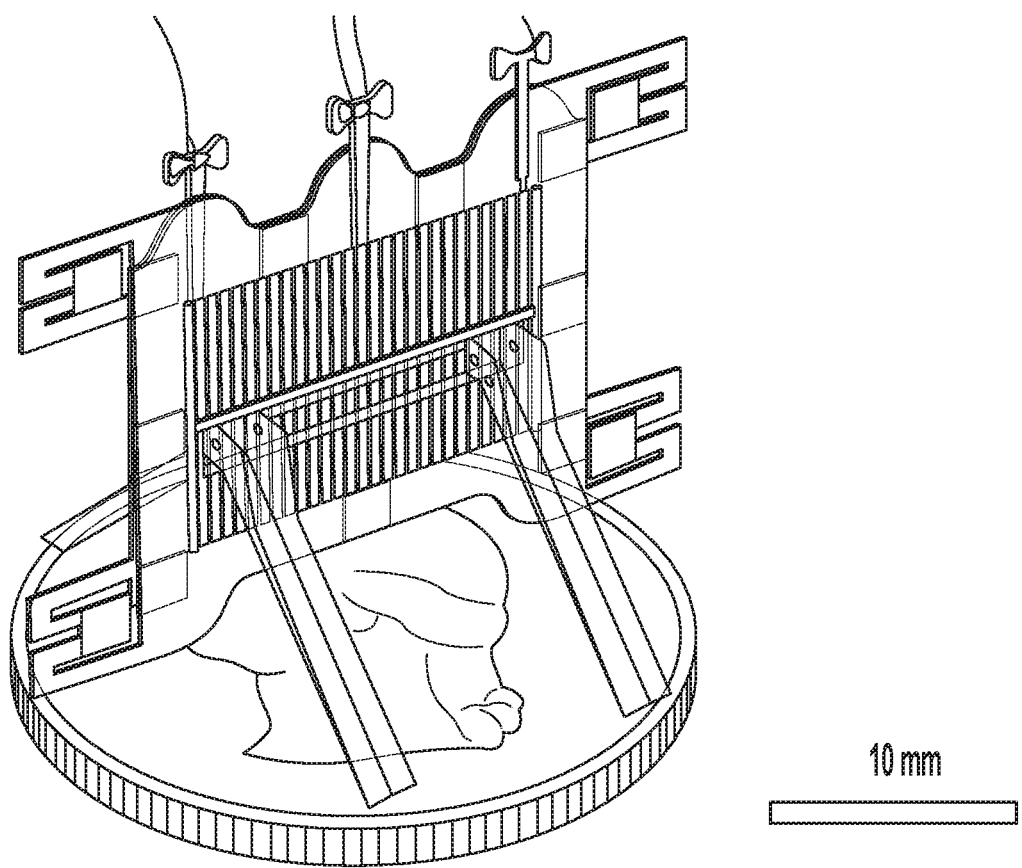
FIG. 5 shows a 132 mg thin-film crawling milli-robot with an integrated bidirectional repulsive-attractive-force electrostatic actuator using V2-A electrode patterns.
Figure 11:
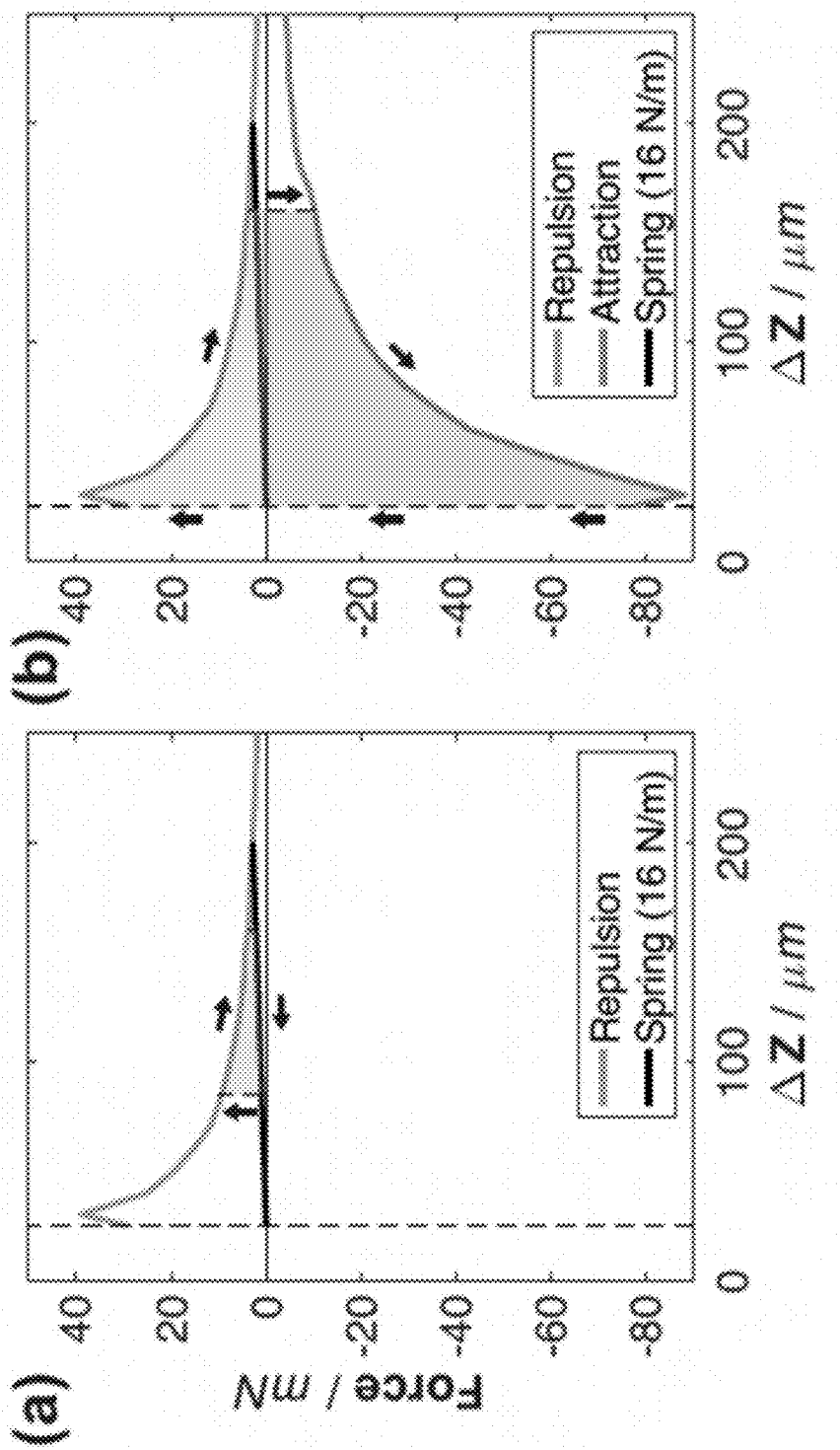
FIG. 11 shows work loops for RFA (a) and RAFA (b), based on actuator (FIG. 9), robot design (FIG. 10), foot friction (FIG. 13), and spring forces. RAFAR's actuator has 42% smaller area, thus correspondingly reduced forces are expected for the fabricated robot.
Figure 12:
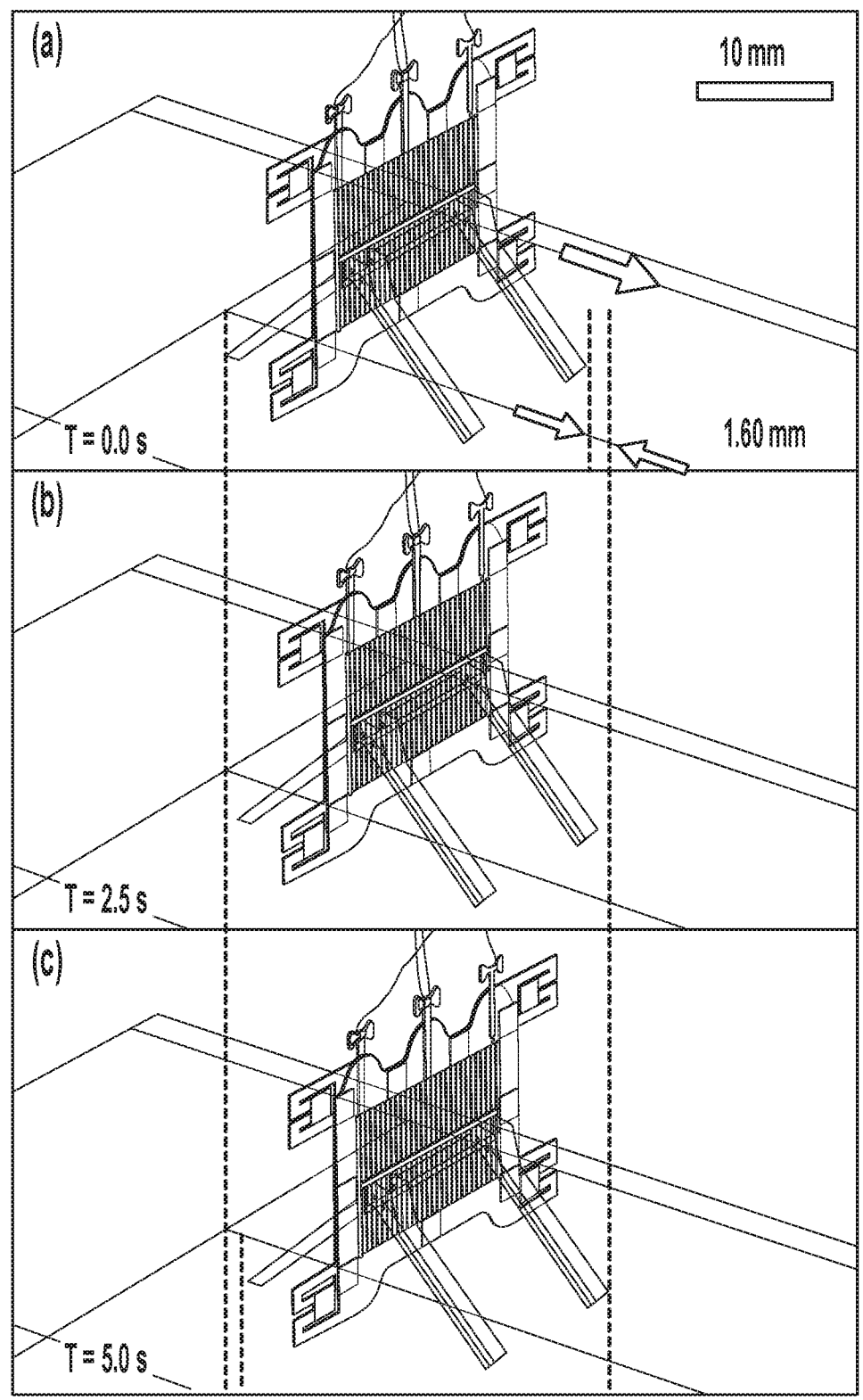
FIG. 12 shows a RAFAR crawling sequence at the start (a), middle (b), and end (c) of 5 steps (1.60 mm traveled).

We present a new bidirectional, thin-film Repulsive-/Attractive-Force electrostatic Actuator (RAFA), and use it to construct a 132 mg milli-robot (FIG. 5). RAFAs generate active, voltage-controlled forces throughout the full actuation cycle (both extension and retraction), yielding larger work-loops than unidirectional actuators with passive spring returns (FIG. 11). RAFAs use simple integrated springs and spacers for alignment (bidirectional slider film motors need tensioners, yaw guards, etc.), and employ no exotic materials or manufacturing processes.

Electrostatic actuators include sets of differentially-polarized electrodes that operate in one of two modes: attractive-force actuators (AFAs) generate attractive forces and gap-closing motion while repulsive-force actuators (RFAs) generate repulsive forces and gap-opening motion. AFAs have unstable operation (pull-in instability) and stroke length is limited by the initial electrode gap. RFAs have open-loop stable operation (force, displacement are directly proportional to voltage) and stroke length is limited only by the electric field strength. Both RFAs and AFAs can operate in series to increase stroke length.

RFAs were initially developed by Tang, et al. [18], to levitate a MEMS resonator's moving electrodes. He et al. further investigated MEMS RFA designs [6], simulated multilevel RFAs [7], and fabricated 1-/2-DoF micro-mirrors [8,9] and low-voltage RFAs [19].

Schaler, et al. [16] introduced cm-scale linear and rotational thin-film RFAs with a new, higher-force electrode pattern. Then, [15] demonstrated multi-layer thin-film RFAs and a 2-DoF micro-mirror. Thin-film RFAs include metal foil/polyimide composites that are inexpensive, simple to fabricate, and allow greater flexibility in electrode configurations or multi-layer devices than MEMS equivalents.

RAFAs employ two control signals to selectively operate one actuator as a RFA or AFA, and achieve bidirectional actuation. Bidirectional motion with two antagonistic actuators was shown using AFAs [11], RFAs [15], and bimorph piezoelectric actuators [20]. Bidirectional motion of one MEMS electrode operated as a RFA/AFA was shown in [14], but required individual control signals to 6+ adjacent electrodes.

Simulation

Three actuator electrode designs are investigated for maximizing repulsive-work (see FIG. 2):

V2 Symmetric electrodes, all of equivalent size/pitch
V2-H Hierarchical electrodes, all of equivalent size but clustered in groups by varying pitch
V2-A Asymmetrical electrodes, with consistent pitch but positive/negative electrodes of non-equivalent size In each case, the actuator layers are modeled with dimensions equivalent to the fabricated actuator layers described below. Positive and negative metal electrodes are defined on opposing sides of an insulating substrate (a continuous dielectric film) and offset by a patterned adhesive film.

For each RFA design, the electric potential (V), electric field ($\underline{E}$) vector, and corresponding bound/free surface ($\sigma_b$, $\sigma_f$) and volumetric ($\rho_b$, $\rho_f$) charge densities are calculated via finite differences simulation. The electrostatic force on a region of the actuator is:

$$\underline{F} = \iiint_{V_E} (\rho_f \underline{E}) d\mathbb{V} + \iiint_{V_D} (\rho_f \underline{E}) d\mathbb{V} + \iint_S (\tfrac{1}{2})(\sigma_f + \sigma_b) \underline{E} \cdot \hat{n}) d\mathbb{S} \quad (1)$$

with force contributions from the electrode ($\mathbb{V}_E$) and dielectric ($\mathbb{V}_D$) volume interiors and the interfacing surfaces between these regions ($\mathbb{S}$, with surface normal vector $\hat{n}$). The electrostatic pressure is calculated by dividing the electrostatic force by electrode area (with lengths based on multiples of electrode pitch). The actuator work (W):

$$W = \int_{\Delta Z_0}^{\Delta Z_1} \underline{F}(\Delta Z) dZ \quad (2)$$

is estimated by piecewise integration of the electrostatic force at a range inter-layer heights ($\Delta Z$). Subsequently the V2-A design was also modeled with the RAFA electrode polarization to determine attractive force and work over an equivalent range.

The work-optimized electrode geometry is determined by solving the nonlinear, convex optimization problem:

$$\min_{x} -W(x), \text{ with } x = [L_P, L_N, \text{Pitch}] \quad (3)$$

$$W(x) = P(x) \cdot \int_{\Delta Z_0}^{\Delta Z_1} F_z(x, \Delta Z) dZ \quad (4)$$

$$P(x) = \frac{F_z(\underline{x}, \Delta Z, \Delta Y)}{F_z(\underline{x}, \Delta Z, 0)} \quad (5)$$

subject to constraints:

$L_P, L_N \in [250 \text{ μm}, 1000 \text{ μm}]$ $\text{Pitch} \geq L_P, L_N$ $\text{Pitch} \leq 5000 \text{ μm} \quad (6)$ Work (W) is maximized for a given actuator electrode geometry (x), and calculated by piecewise integration of the normal component of the actuator force ($F_z$) at a range inter-layer heights $\Delta Z \in [\Delta Z_0, \Delta Z_1] = [25, 500]$ μm. A misalignment penalty (P) is imposed on the work calculation to prevent the optimization from converging to a solution with alignment requirements beyond manufacturing capabilities. Here, a misalignment of $\Delta Y = 25$ μm is used and the force decrease is compared at $\Delta Z_0 = 25$ μm.

Constraints are imposed by physical limitations on minimum feature size (100 μm) for fabrication/alignment, on minimum pitch (greater than electrode widths), and on maximum feature size (1000 μm) for a reasonably compact actuator system and to limit the search space. The optimization problem is solved in Matlab using the fmincon nonlinear programming solver and sequential quadratic programming (SQP) algorithm.

FIG. 2 shows three flexible, two-layer repulsive-force actuator designs according to some embodiments: (a) V2, the electrode design used in Schaler, et al. [100], (b) V2-H, a design with hierarchical electrodes, and (c) V2-A, a design with asymmetrical electrodes. For each actuator electrode design, the two functional layers are photographed (a-c) and the cross-sections are illustrated (d-f). Each actuator layer includes a polyimide substrate (i) with negative (ii) and positive (iii) electrodes. Actuator layers experience a net repulsive electrostatic pressure, illustrated in (e). Actuator dimensions include the substrate (T1=60 μm) and electrode (T2=12.5 μm) thickness, positive ($L_P$) and negative ($L_N$) electrode width, pitch (Pitch), and inter-layer height (ΔZ), listed hereafter as x=[$L_P$, $L_N$, Pitch]. For V2, x=[500, 500, 1000] μm ($L_P$=$L_N$=Pitch/2); for V2-H, x=[167, 167, 1000] μm in clusters of two electrodes separated by 333 μm pitch; for V2-A, x=[300, 400, 500] μm.

Figure 6:
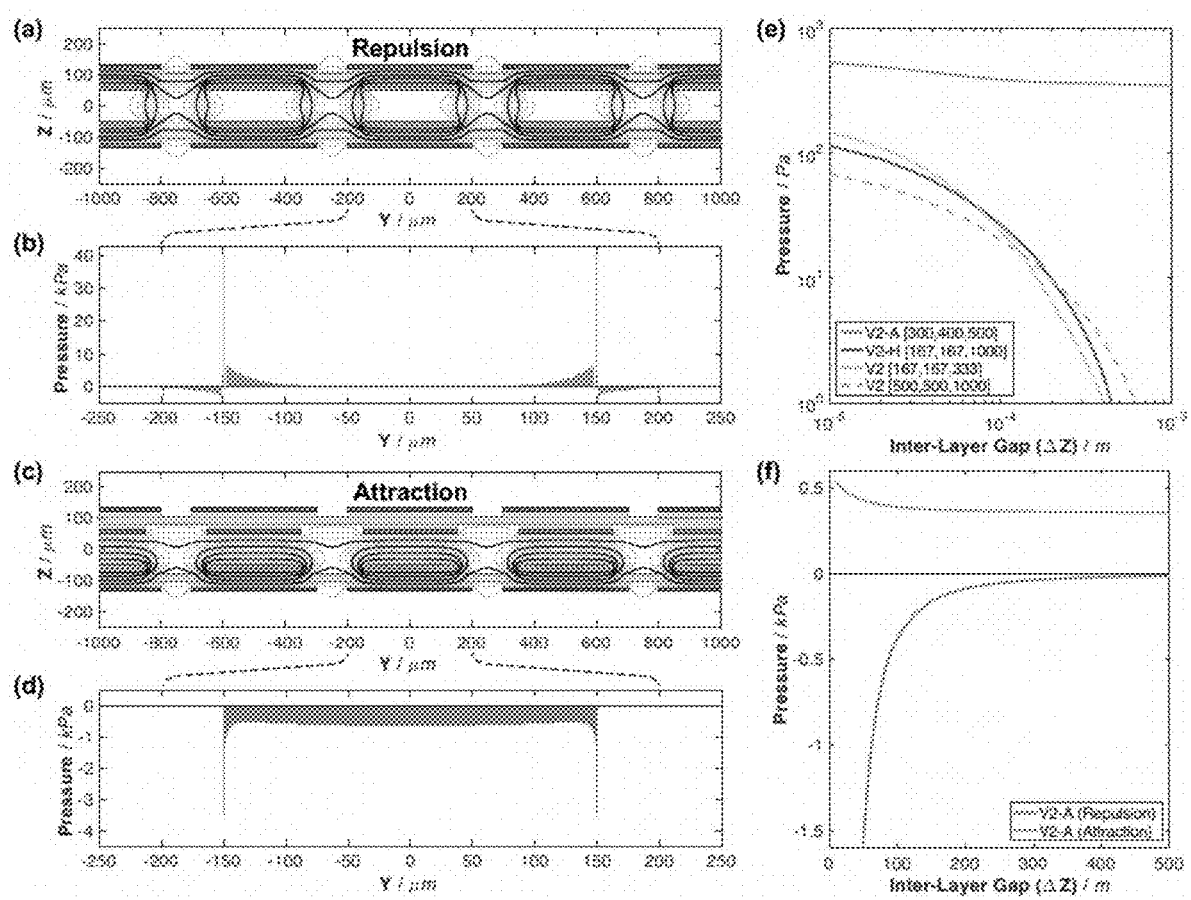
FIG. 6 shows simulation results for a bidirectional repulsive-attractive-force electrostatic actuator according to some embodiments of the invention. (a/c) Electrostatic potential (V) for V2-A design, with electrodes operating at 0 kV (blue)/1.2 kV (red) and dielectric substrate (orange). (b/d) Net electrostatic pressure across the top layer of the V2-A design, focusing on the center electrode and with 1 μm mesh size. (a-b) are operating in repulsion-mode; (c-d) are operating in attraction-mode. (e) Net electrostatic pressure produced by a complete actuator versus layer separation ($\Delta Z$) in each design, with dimensions of $\underline{x}=[L_P, L_N, \text{Pitch}]$. Operating voltage is 1.2 kV. (f) Net electrostatic pressure produced by a complete V2-A actuator versus layer separation ($\Delta Z$) in both repulsion- and attraction-modes.
Figure 7:
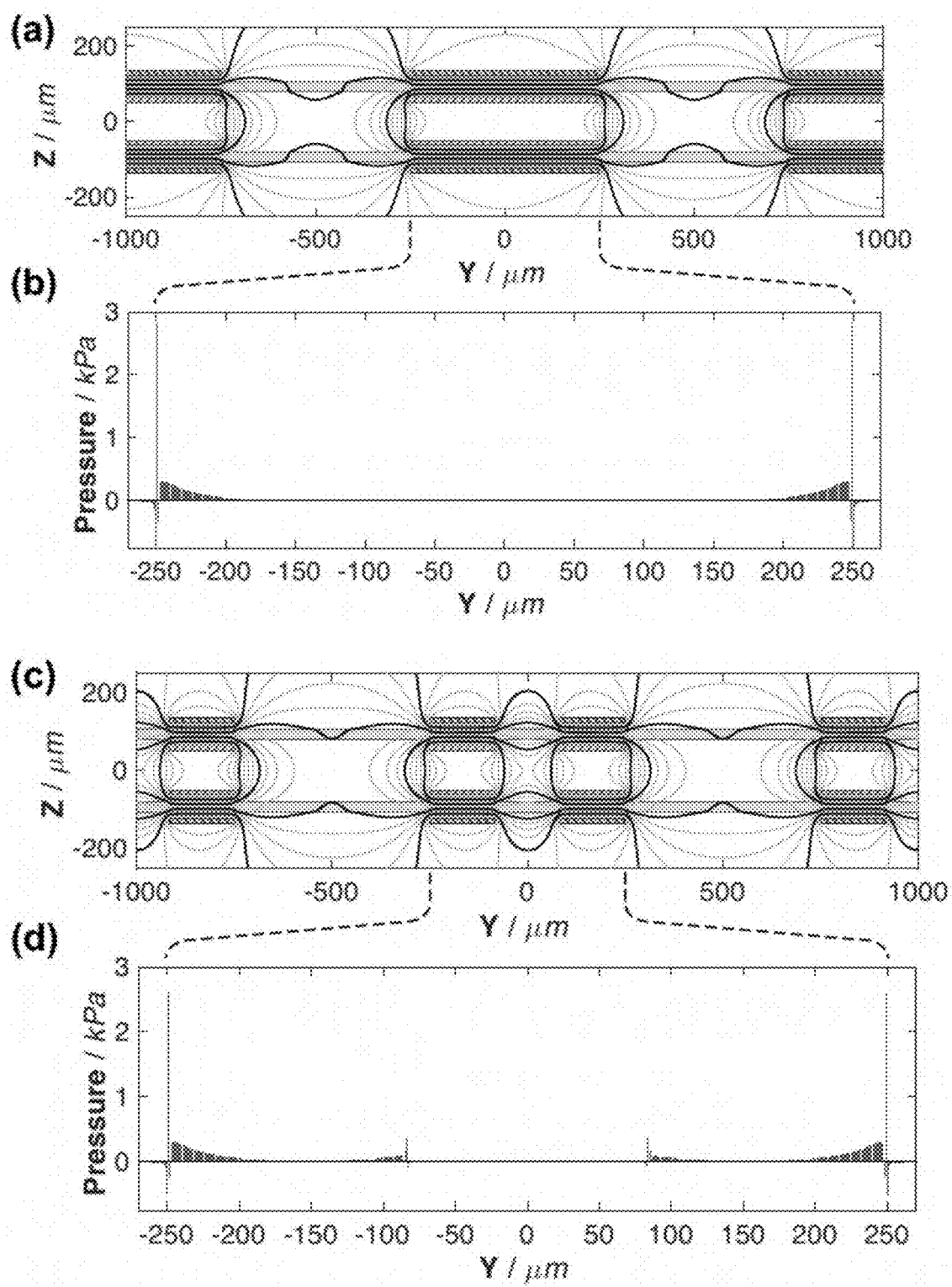
FIG. 7 shows simulation results for the repulsive-attractive-force electrostatic actuator, using the V2 (a-b) and V2-H (c-d) electrode configurations. (a/c) Electrostatic potential (V) for V2/V2-H designs, with electrodes operating at 0 V (blue)/1.2 kV (red) and dielectric substrate (orange). (b/d) Net electrostatic pressure across the top layer of the V2/V2-H designs, focusing on the center electrode and with 1 μm mesh size. Although only the repulsive forces are calculated in this figure, the V2 and V2-H electrode configurations can also generate attractive forces.

The V2, V2-H, and V2-A RFA electrode designs are compared in FIG. 6. The V2 symmetric electrode design (FIG. 2, panels a/d), first presented in [16], employed equal-sized positive and negative electrodes x=[500, 500, 1000]μm, which provided a decent balance of high peak force (increases with smaller unit cells), and force reduction at greater ΔZ offsets (decreases as inter-layer distance increases, and decreases faster with smaller unit cells). This behavior is evident when comparing x=[500, 500, 1000] μm and x=[167, 167, 333] μm in FIG. 6, panel e.

The V2-H hierarchical electrode design (FIG. 2, panels b/e) provides a compromise on the performance of both large and small unit cell sizes in the V2 design. For this V2-H [167, 167, 1000] μm pattern, peak force is higher than the V2 [500, 500, 1000] pattern at all ΔZ≤200 μm (due to a greater number of fringing fields) and higher than the V2 [167, 167, 333] unit cell design at distances of ΔZ>70 μm (due to a more gradual reduction in force at larger ΔZ).

The V2-A asymmetric electrode designs (FIG. 2, panels c/f) are quite different: positive and negative electrodes are of unequal size, and pitch is less than twice the electrode widths (to reduce unit cell size and increase electrode density). This V2-A electrode design was discovered during the course of the parameter space exploration for the work-optimization simulations. The V2-A design with x=[300, 400, 500] μm was derived from the optimal design x=[307, 391, 451] for a ΔY=10 μm misalignment penalty. $L_P$, $L_N$ parameters were rounded to the nearest 100 μm, and Pitch was increased to $L_N$+100 μm to conform to manufacturing tolerances. An interesting simulation result of these designs is the force reduction trend as ΔZ increases: the typical $F \propto \Delta Z^{-2}$ falloff in force is less pronounced at ΔZ≥150 μm and sustained 0.35-0.36 kPa pressures are predicted even at ΔZ≥500 μm gaps. Note that this behavior is not reflected in the measured actuators (FIG. 9).

A new capability of these V2/V2-H/V2-A electrode geometries is the ability to generate both repulsive- and attractive-forces (FIG. 6, panels a-d/f). This uses two channels to independently control the potential on each actuator layer: layers generate a net repulsive force when the two internal electrodes operate at $V_+$; layers generate a net attractive force when the two internal electrodes differentially operate at $V_1 \ll V_2$ (or vice versa).

As seen in FIG. 6, panel f, both repulsive- and attractive-forces scale inversely proportional to displacement. Electrostatic pressures of 0.43-0.36 kPa (repulsion) and −1.55-−0.055 kPa (attraction) are generated with the same V2-A electrode geometry and ΔZ=25-250 μm range of inter-layer gaps.

Figure 8:
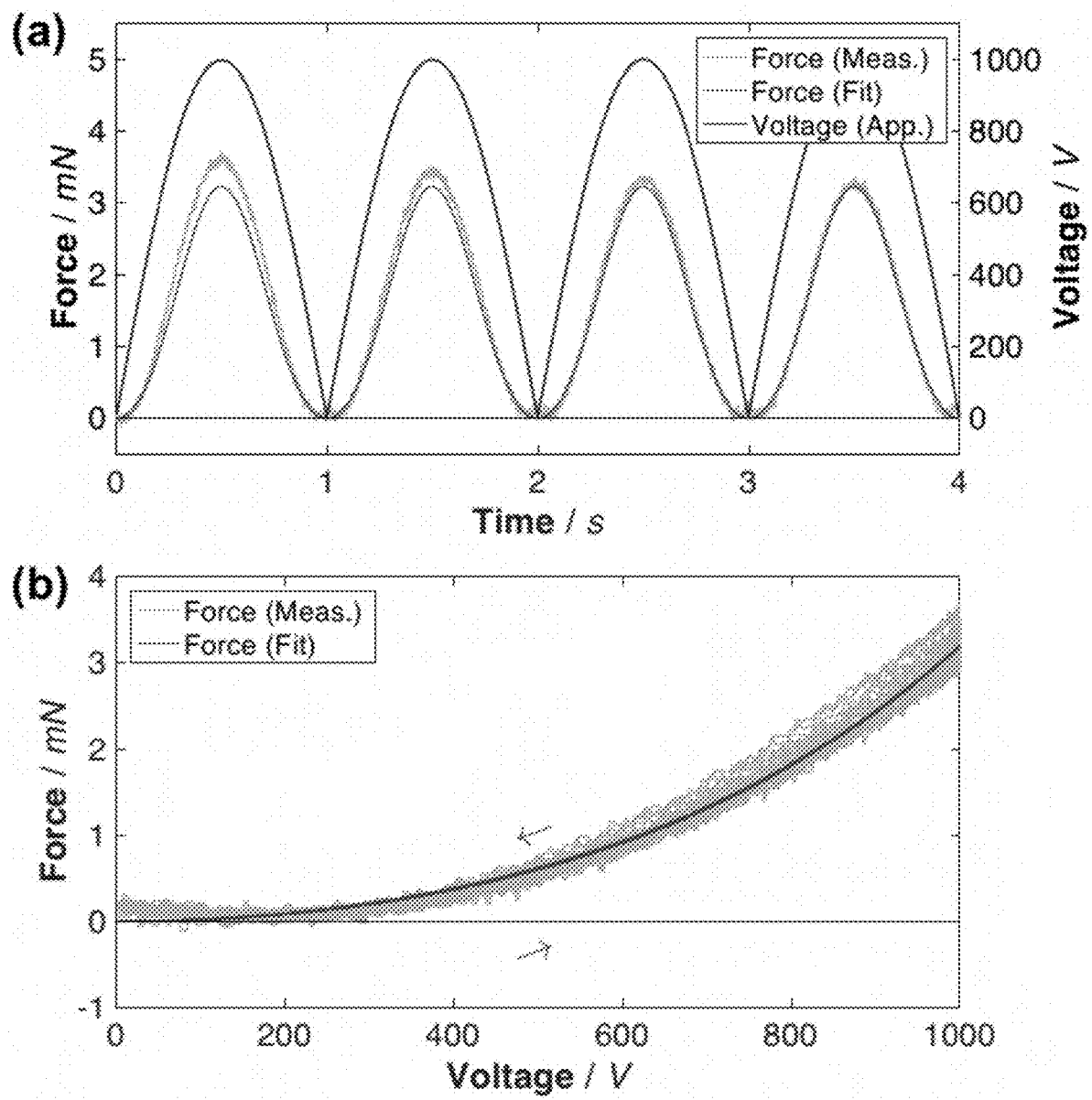
FIG. 8 shows results for a repulsive-attractive-force-actuator with V2-A electrode pattern generating repulsive-forces at $\Delta Z=100$ μm and 0-1.0 kV. (a) Applied square-root of sinusoid voltage and measured force versus time, with sinusoidal fit. (b) Measured force versus applied voltage, with the same fit.
Figure 9:
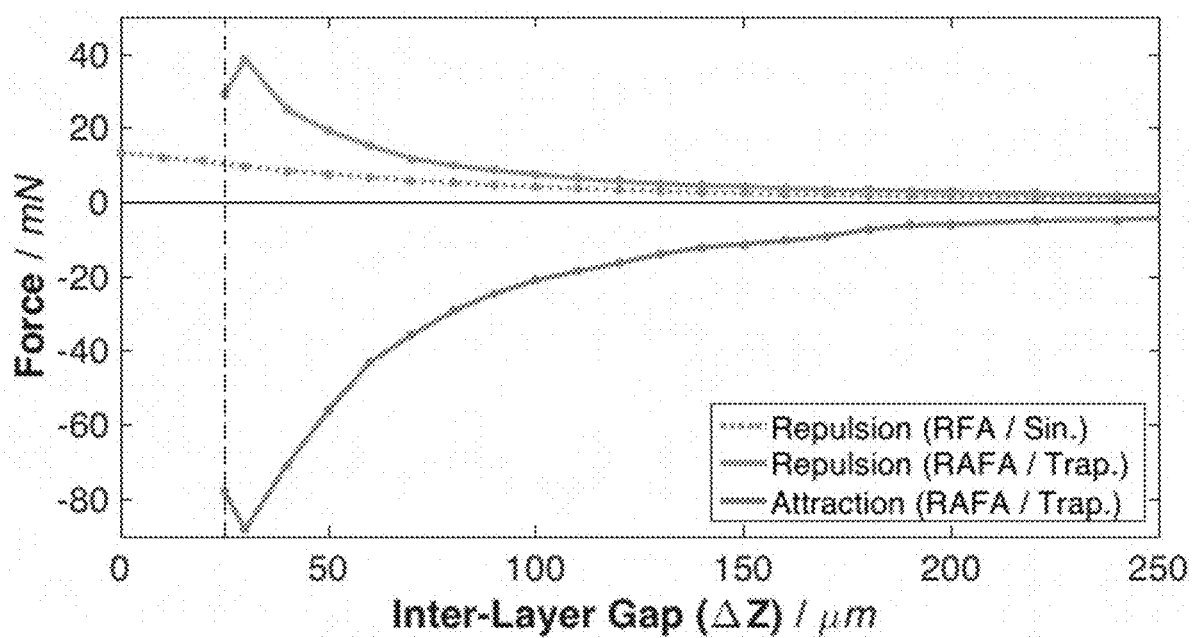
FIG. 9 show repulsive- and attractive-forces controllably generated by a thin-film electrostatic actuator. Measured forces for a 2.5 cm$^2$ actuator operating in repulsive-force actuation (RFA) and repulsive-/attractive-force actuation (RAFA) modes, with sinusoidal (Sin.) and trapezoidal (Trap.) waveforms. Peak applied voltage in all cases is approx. 1.2 kV. Vertical dashed line marks contact point ($\Delta Z=25$ μm) of the two layers (in RAFA-mode) due to an inter-layer polyimide insulator.

The V2-A electrode design was selected to be fabricated (FIG. 2) and characterized (FIGS. 3, 8, and 9). RFA layers are fabricated using both an in-house laser-cutting process and a commercial wet-etching process at a flex-PCB manufacturer. In the laser-cutting process, layers are composed of stainless steel electrodes (Trinity Brand Industries, 12.7 m) on a polyimide substrate (DuPont, Kapton FPC, 25 μm), bonded together with thermally-activated sheet adhesive (GBC, Octavia Hot Mount Adhesive, 17.5 μm).

The electrodes are prepared by cleaning a sheet of stainless steel, laminating thermal adhesive to one side, and securing the other side to GelPak (with the adhesive face-up). The substrate is prepared by cleaning the Kapton and securing it to another GelPak surface. The actuator electrode pattern and substrate extents are cut into the respective material layers using a UV laser cutter (PhotoMachining Inc., 355 nm laser). Excess mask and substrate material are removed manually. The substrate/electrode layers are run through a laminator to set the thermal adhesive. Any exposed thermal adhesive is removed with acetone (Fischer Scientific). Production time is approximately 2-3 hours per sheet of actuator layers (compared to >4 hours for the wet-etching process in [16]). In the wet-etching process, layers are composed of a flexible circuit composite (Dupont, Pyralux AP8515) with 18 μm copper foil electrodes bonded to each side of a 25 μm polyimide substrate.

A commercial manufacturer of flexible circuit boards (The Boardworks) was used to pattern an array of two-sided actuator layers (72 layers at $3.40 per layer) on a single 9×12 inch sheet of Pyralux AP. The copper foil was etched in a wet-etch process, with electrode patterns aligned on both sides of the polyimide substrate. The polyimide substrate was subsequently patterned using the UV laser cutter. The resulting individual actuator layers (cut out of the full sheet) contain patterned electrodes surrounded by 4 polyimide suspension springs.

RAFA layers can optionally adhere film spacers (50-100 μm thick) or an extra polyimide film insulator (25 μm) over the $V_+$ electrode on one layer for shorting protection between layers during attractive-mode operation.

As introduced above, there are three processes currently available for RFA/RAFA fabrication: in-house laser-cutting or wet-etching processes, and out-sourced commercial wet-etching. The processes are compared in Table 1.

The in-house processes are ideal for iterative prototyping of new robots, actuators, or electrode patterns, but produce lower electrostatic pressures due to worse electrode alignment/accuracy or thicker substrates. The commercial flexible circuit fabrication process allows anyone to produce large quantities of actuators with higher pressures, consistently accurate electrode patterns, and the best electrode alignment. The RFA/RAFA could also be fabricated using a conductive ink printing processes for roll-to-roll bulk fabrication on thin-film substrates.

TABLE 1

Comparison of actuator fabrication processes

| Metric | Laser (IH) | Etch (IH) | Etch (C) |
|---|---|---|---|
| Prototype Fabrication | + | ○ | − |
| Bulk Fabrication | ○ | − | + |
| Electrostatic Pressure | − | ○ | + |
| Electrode Dimensional Accuracy | + | − | ○ |
| Electrode Alignment (2-Sided) | ○ | − | + |

(IH)—In-House
(C)—Commercial

The repulsive forces of the fabricated actuator layers were characterized using the same blocked-force testing apparatus presented in [16]. The actuator layers are laminated to glass slides. The first layer is secured to an XY-stage; the second layer is mounted to the load cell and Z-stage with a wax interface (for proper leveling). Actuators are controlled by a DAQ (NI, USB-6341) and Labview, and powered by high-voltage amplifiers (Trek, PZD700/XP Power, G-60).

RFA-mode testing uses a sinusoidal signals of 0-1.2 kV and 2 Hz. RAFA-mode testing uses trapezoidal signals of 0-1.2 kV and 1 Hz (with 0.1 s ramps and 0.25 s holds at peak repulsive/attractive forces).

FIG. 8 demonstrates the blocked-force performance of the RFA. The RFA generates smooth sinusoidal forces (the quadratic relationship between applied voltage and measured force is shown in FIG. 8, panel b) with no discernible lag or nonlinearities. Minimal hysteresis is visible and dielectric charging results in only a 14% decrease in peak force over 10 cycles.

FIG. 3 demonstrates the blocked-force performance of the RAFA. The RAFA quickly tracks the trapezoidal waveform during voltage ramps (in grey) and maintains stable repulsive—and attractive-forces during voltage holds at 1.0/1.0 kV ($V_1/V_2$) and 1.0/0.5 kV ($V_1/V_2$), respectively. Note that square waveforms reduce polyimide's mean-time-to-failure [12], and are avoided. The RAFA was tested for up to 100 cycles using this waveform (at 1 Hz), with dielectric charging causing a −19%/+10% change in repulsive/attractive force after 10 cycles and −35%/+20% change after 100 cycles (amounting to a 1.2 mN decrease in peak forces). During unpowered (0 V) periods, the RAFA exhibits near-zero force production—indicating minimal residual charge.

FIG. 9 presents the actuator force versus ΔZ offset, with both sinusoidal and trapezoidal applied voltages. Peak repulsive forces of 38.9 mN (156 Pa at 2.5 cm² electrode area) and peak attractive forces of 80.0 mN (356 Pa) were measured at ΔZ=30 μm and 1.2/0 kV ($V_1/V_2$).

Figure 10:
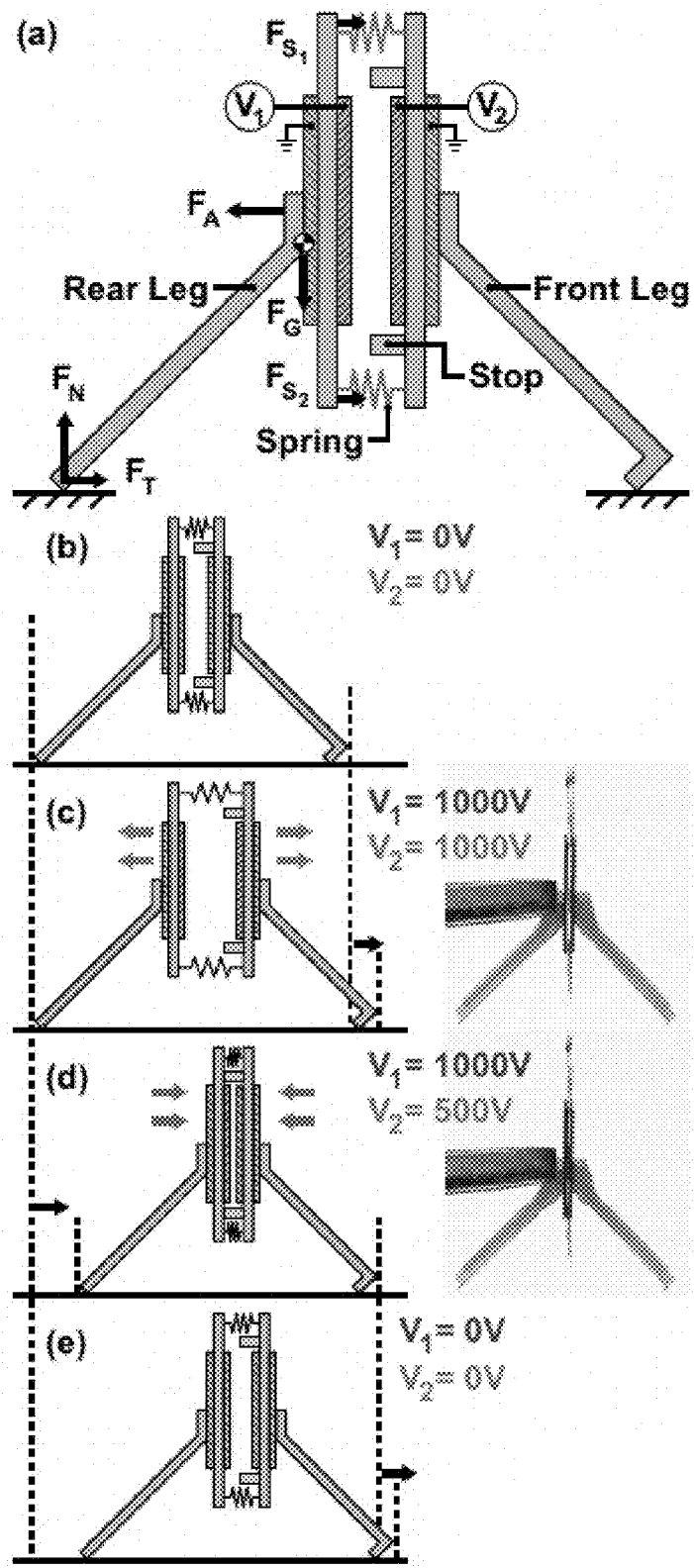
FIG. 10 shows a repulsive-/attractive-force electrostatic actuator robot (RAFAR) cross-section and crawling behavior—cycling between extension of the front legs (c) (with repulsive-force) and retraction of the rear legs (d) (with attractive-force).

The Repulsive-/Attractive-Force Actuator Robot (RAFAR) is a thin-film milli-robot developed with an integrated 2-layer RAFA (FIG. 5). The assembled robot has dimensions of 20 (long)×27 (wide)×22 (tall) mm, a total mass of 132 mg, and uses an inchworm crawling sequence to locomote (FIG. 10). The robot successfully crawls on an aluminum foil substrate at an average speed of 0.32 mm/s (0.012 BL/s) over 5 steps at 1 Hz, and its performance is compared to other milli-robots in Table 2.

Figure 13:
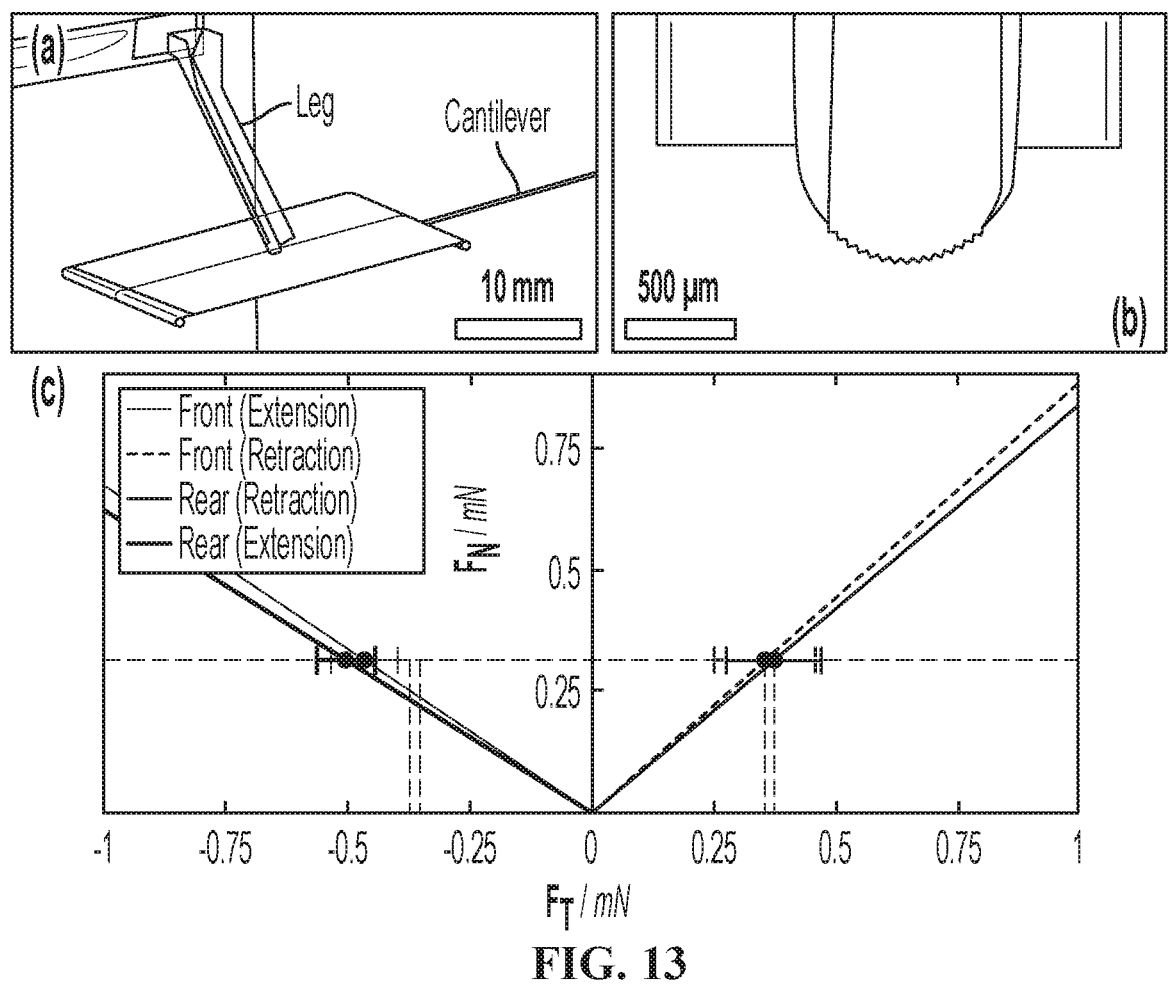
FIG. 13 shows a fabricated 5 mg leg on a friction-testing stand (a) with close-up of a rear foot (b). The feet exhibit anisotropic friction (c) by terminating in a circular array of 50 μm spines. The front foot may extend during repulsive-actuation (green) and the rear foot may retract during attractive-actuation (purple). Foot friction is measured with $F_N=mg/4$ (horizontal dashed line) and is lower when legs experience loading in the forward direction (vertical dashed lines, $F_T>0$). Error bars denote $1\sigma$ (n=6) per foot and $F_T$ direction.

The repeating sequence of alternating repulsive-/attractive-forces used for this crawling pattern was successfully generated (FIG. 3). Use of both repulsive- and attractive-actuation substantially increases the potential work-loop (over an equivalent spring restoring force), as shown in FIG. 11. Actuator displacements require that generated actuator forces (measured in FIG. 9) be greater than measured foot friction forces (FIG. 13). This sequence also depends on foot friction anisotropy (characterized in FIG. 13) for forward motion.

The RAFAR includes a 2-layer RAFA that was wet-etched by a commercial vendor and uses the V2-A electrode configuration ([300, 400, 500] μm) to ensure the highest force production possible. The RAFA layers are connected via a folded-spring suspension (four springs located at actuator corners) that provides actuator layer alignment, mechanical constraints (compliant to normal force/stiff to shear force), and some restoring force. The RAFA is reinforced by three carbon fiber rods (Ø 280 m) adhered to each ground electrode (to avoid affecting the electric field) and PET spacers (2×2×0.118 mm thick) that are adhered to one actuator layer around the perimeter of the internal electrodes. The spacers act as mechanical stops to maintain inter-layer spacing (ΔZ≥100 μm) and prevent electrode contact/shorting during attractive-mode operation. Total mass is 132 mg, including: actuator (107 mg), carbon fiber reinforcement (6.0 mg), legs (19.0 mg, 4×4.75 mg).

Power is supplied to the robot via four 75 μm wires ($V_1$, $V_2$, and 2 V_grounds), which are soldered directly to electrode pads on each actuator layer. The wires are routed via an overhead arm, and are lightweight and flexible to minimize impact on robot dynamics. Two high-voltage amplifiers (Trek, PZD700) power the two actuator layers.

TABLE 2

Survey of actuators used for meso-scale walking/crawling robots. Robots with greater capabilities—untethered (Tether) and steerable (Steer)—are rated higher (+) than those without (o).

| Actuator Design | Act. | Tether | Steer | M/g | Dim./m³ | Speed/m/s | BL/s | V/V | Source |
|---|---|---|---|---|---|---|---|---|---|
| Scratch Drive Electro. | 2 | + | + | — | $60 \times 250 \times 10 \cdot 10^{-6}$ | $2.0 \cdot 10^{-4}$ | 1.25 | ±140 | 4 |
| Scratch Drive Electro. | 1 | o | o | — | $30 \times 15 \times 10 \cdot 10^{-3}$ | $3.7 \cdot 10^{-4}$ | 0.122 | 4000 | 17 |
| Zipper Electro. | 1 | o | o | 0.55 | $60 \times 10 \times 10 \cdot 10^{-3}$ | $5.5 \cdot 10^{-4}$ | 0.009 | 700 | 2 |
| Vibrating Electro. | 1 | o | o | 0.047 | $25 \times 25 \times 12 \cdot 10^{-3}$ | $3.0 \cdot 10^{-2}$ | 1.2 | 2500 | 13 |
| Vibrating Electro. | 1 | + | o | 0.190 | $25 \times 25 \times 12 \cdot 10^{-3}$ | $2.0 \cdot 10^{-3}$ | 0.08 | 3000 | 13 |
| Unimorph Piezo. | 1 | o | + | 3.0 | $50 \times 10 \times 9 \cdot 10^{-3}$ | $1.4 \cdot 10^{-1}$ | 2.8 | 140 | 3 |
| Bimorph Piezo. | 6 | o | + | 1.27 | $44 \times - \times - \cdot 10^{-3}$ | $3.7 \cdot 10^{-1}$ | 8.4 | 200 | 1 |
| Bimorph Piezo. | 8 | + | + | 2.8 | $45 \times - \times - \cdot 10^{-3}$ | $1.7 \cdot 10^{-1}$ | 3.8 | 200 | 5 |
| Shape Memory Alloy | 2 | + | + | 2.4 | $30 \times - \times - \cdot 10^{-3}$ | $3 \cdot 10^{-2}$ | 1.0 | 13.6 | 10 |
| RAFA | 1 | o | o | 0.132 | $20 \times 27 \times 22 \cdot 10^{-3}$ | $3.2 \cdot 10^{-4}$ | 0.012 | 1000 | This Work |

Act.—Number of Actuators
M—Mass
Dim.—Dimensions
BL/s—Body Lengths per Second
V—Operating Voltage The robot's leg design is seen in FIG. 13, mounted in a friction testing setup consisting of a paper friction pad on a cantilevered rod (k=0.29 N/m). A known normal force (FN) is applied to the leg and transverse force ($F_T$) is increased until the foot slips.

The robot feet are anisotropic FIG. 13, panel b. The front and rear legs are constructed of polyimide film (50 μm) with approximately 50 μm long spines. The spines contact the ground at a 45° angle pointing rearward (front legs have a 90° bend above the spines) to ensure anisotropic friction (FIG. 13, panel c). Static friction is 1.3× greater for $F_T<0$, ensuring feet will preferentially slide forward.

We have demonstrated a bidirectional, thin-film Repulsive-/Attractive-Force electrostatic Actuator (RAFA). The 2-layer RAFA employs a new, optimized electrode geometry for higher force production and is capable of controllably generating both repulsive and attractive forces by varying the applied voltage to each layer. Measured forces up to 156 Pa (38.9 mN, for 2.5 cm$^2$ electrode area) in repulsion and 352 Pa (88.0 mN) in attraction were generated when operating at 0-1.2 kV.

We also demonstrate the RAFAR, a 132 mg milli-robot powered by a RAFA and capable of crawling at 0.32 mm/s (0.012 BL/s) using 1 Hz/0-1.0 kV bidirectional actuation.

This bidirectional RAFA—capable of controllably generating repulsive- and attractive-forces—is of value to the MEMS and milli-robotics communities alike. Repulsive-force actuators provide inherently open-loop stable actuation with peak force at initial displacements. Attractive-force actuators provide a voltage-controllable restoring force with greater magnitude than a mechanical spring force. As a result, the RAFA is ideal for applications that require electrostatic actuation with greater work-loops than unidirectional actuators (with spring returns), such as the crawling robot described herein.

REFERENCES

[1] A. T. Baisch, R. J. Wood, "Pop-up assembly of a quadrupedal ambulatory MicroRobot," in *IEEE IROS*, 2013, pp. 1518-1524.

[2] A. S. Chen, H. Zhu, Y. Li, L. Hu, and S. Bergbreiter, "A paper-based electrostatic zipper actuator for printable robots," in *IEEE ICRA*, 2014, p. 5038.

[3] A. G. Dharmawan, H. H. Hariri, S. Foong, G. S. Soh, and K. L. Wood, "Steerable miniature legged robot driven by a single piezoelectric bending unimorph actuator," in *IEEE ICRA*, 2017, pp. 6008-6013.

[4] B. Donald, C. Levey, C. McGray, I. Paprotny, and D. Rus, "An Untethered, Electrostatic, Globally Controllable MEMS Micro-Robot," *J. Microelectromech. Syst.*, vol. 15, no. 1, pp. 1-15, 2006.

[5] B. Goldberg, R. Zufferey, N. Doshi, E. F. Helbling, M. Kovac, R. J. Wood, and G. Whittredge, "Power and Control Autonomy for High-Speed Locomotion With an Insect-Scale Legged Robot," *IEEE RA-L*, vol. 3, no. 2, pp. 987-993, 2018.

[6] S. He and R. Ben Mrad, "Large-stroke microelectrostatic actuators for vertical translation of micromirrors used in adaptive optics," *IEEE Trans. Ind. Electron.*, vol. 52, no. 4, pp. 974-983, 2005.

[7] S. He, R. B. Mrad, "Performance assessment of a multi-level repulsive-force out-of-plane microelectrostatic actuator," *Can. J. Elect. Comput. Eng.*, vol. 31, no. 2, pp. 71-75, 2006.

[8] S. He, R. B. Mrad, "Design, modeling, and demonstration of a MEMS repulsive-force out-of-plane electrostatic micro actuator," *J. Microelectromech. Syst.*, vol. 17, no. 3, pp. 532-547, 2008.

[9] S. He, R. Ben Mrad, and J. Chong, "Repulsive-force out-of-plane large stroke translation micro electrostatic actuator," *J. Micromech. Microeng.*, vol. 21, no. 7, p. 075002, 2011.

[10] A. M. Hoover, E. Steltz, and R. S. Fearing, "RoACH: An autonomous 2.4 g crawling hexapod robot," *IEEE IROS*, pp. 26-33, 2008.

[11] Keng Peng Tee, S. Ge, and F. Eng Hock Tay, "Adaptive Control of Electrostatic Microactuators With Bidirectional Drive," *IEEE Trans. Control Syst. Technol*, vol. 17, no. 2, pp. 340-352, 2009.

[12] T. Lebey, P. Castelan, G. Montanari, and I. Ghinello, "Influence of PWM-type voltage waveforms on reliability of machine insulation system," in *IEEE Int. Conf. on Harmonics and Quality of Power*, vol. 2, 1998, pp. 994-998.

[13] M. Qi, Y. Zhu, Z. Liu, X. Zhang, X. Yan, and L. Lin, "A fast-moving electrostatic crawling insect," in *MEMS*, 2017, p. 761.

[14] H. Ren, W. Wang, F. Tao, and J. Yao, "A Bi-Directional Out-of-Plane Actuator by Electrostatic Force," *Micromachines*, vol. 4, no. 4, pp. 431-443, 2013.

[15] E. W. Schaler, L. Jiang, and R. S. Fearing, "Multi-Layer, Thin-Film Repulsive-Force Electrostatic Actuators for a 2-DoF Micro-Mirror," in *Actuators* 2018 (to appear), Bremen, 2018, p. 4.

[16] E. W. Schaler, T. I. Zohdi, and R. S. Fearing, "Thin-film repulsive-force electrostatic actuators," *Sens. Actuators. A Phys.*, vol. 270, pp. 252-261, 2018.

[17] H. Shigemune, S. Maeda, V. Cacucciolo, Y. Iwata, E. Iwase, S. Hashimoto, and S. Sugano, "Printed paper robot driven by electrostatic actuator," *IEEE Robot. Autom. Lett.*, vol. 2, no. 2, p. 1001, 2017.

[18] W. C. Tang, M. G. Lim, and R. T. Howe, "Electrostatic comb drive levitation and control method," *J. Microelectromech. Syst.*, vol. 1, no. 4, pp. 170-178, 1992.

[19] S. Towfighian, S. He, and R. Ben Mrad, "A low voltage electrostatic micro actuator for large out-of-plane displacement," in *ASME IDETC/CIE*, 2014, pp. 1-7.

[20] R. Wood, E. Steltz, and R. Fearing, "Optimal energy density piezoelectric bending actuators," *Sens. Actuators. A Phys.*, vol. 119, no. 2, pp. 476-488, 2005.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A repulsive-attractive-force electrostatic actuator, comprising:
    a first actuator layer comprising:
        a first substrate of a first dielectric material having a transverse thickness and two opposing surfaces,
        a first electrode pattern at least one of attached to or formed on one of said two opposing surfaces of said first substrate, and
        a second electrode pattern at least one of attached to or formed on the other one of said two opposing surfaces of said first substrate so as to be on an opposing side with respect to said first electrode pattern, and
        wherein said first and second electrode patterns are substantially aligned with each other in a direction of said transverse thickness on said two opposing surfaces of said first substrate;
    a second actuator layer spaced apart from said first actuator layer in the direction of the transverse thickness, with at least one of a vacuum, air, a gas or a dielectric material therebetween, said second actuator layer comprising:
- a second substrate of a second dielectric material having a transverse thickness and two opposing surfaces,
- a third electrode pattern at least one of attached to or formed on one of said two opposing surfaces of said second substrate, and
- a fourth electrode pattern at least one of attached to or formed on the other one of said two opposing surfaces of said second substrate so as to be on an opposing side with respect to said third electrode pattern, and
- wherein said third and fourth electrode patterns are substantially aligned with each other in a direction of said transverse thickness on said two opposing surfaces of said second substrate;

a first voltage source connected to said first and second electrode patterns such that, during operation, each is entirely at a common voltage across the corresponding electrode pattern, said first electrode pattern is at a relative voltage of $V_1$ to said second electrode pattern;

a second voltage source connected to said third and fourth electrode patterns such that, during operation, each is entirely at a common voltage across the corresponding electrode pattern, said third electrode pattern is at a relative voltage of $V_2$ to said fourth electrode pattern; and an actuator frame connected to said first and second actuator layers such that at least a portion of at least one of said first and second actuator layers is movable due to an applied voltage to effect motion to an object at least one of attached to or in mechanical connection to said repulsive-attractive-force electrostatic actuator when in operation, wherein said first and second voltage sources have a common ground, and wherein said applied relative voltages $V_1$ and $V_2$ are selectable to provide one of a selected repulsive force or a selected attractive force between said first and second actuator layers.

2. The repulsive-attractive-force electrostatic actuator according to claim 1, wherein said first and second substrates are each at least one of a thin film or a sheet of a first dielectric material and a second dielectric material, respectively.

3. The repulsive-attractive-force electrostatic actuator according to claim 1, wherein said first and second dielectric materials are each selected from at least one of a polyimide or biaxially-oriented polyethylene terephthalate.

4. The repulsive-attractive-force electrostatic actuator according to claim 1, wherein said first and second dielectric materials are the same dielectric material.

5. The repulsive-attractive-force electrostatic actuator according to claim 4, wherein said first and second dielectric materials are both poly (4,4'-oxydiphenylene-pyromellitimide).

6. The repulsive-attractive-force electrostatic actuator according to claim 1, wherein said first and second dielectric materials are each selected from at least one of a high dielectric strength polymer or polymer composite.

7. The repulsive-attractive-force electrostatic actuator according to claim 1, wherein said first and second dielectric materials comprise at least one of polypropylene, polyethylene, polyimide, polytetrafluorethylene, glass fiber epoxy composite, cellulose, $SiO_2$, $Si_3N_4$, mica, or ultra-thin glass.

8. The repulsive-attractive-force electrostatic actuator according to claim 1, wherein said first, second, third, and fourth electrode patterns comprise conductive materials each selected from at least one of a metal, metal alloy, metallic glass, metallic nanowires, ceramic, polymer, epoxy, paste, ink, carbon nanotubes, or other organic compound.

9. The repulsive-attractive-force electrostatic actuator according to claim 1, wherein said actuator frame is connected to said first and second actuator layers such that one edge thereof is held relatively fixed and an opposite edge is free to move with a cantilever motion.

10. The repulsive-attractive-force electrostatic actuator according to claim 1, wherein said actuator frame is connected to said first and second actuator layers such that at least one of said first and second actuator layers moves in a direction substantially orthogonal to said two opposing surfaces of said first and second substrates to provide substantially translational motion in operation while said first and second substrates remain substantially parallel to each other.

11. The repulsive-attractive-force electrostatic actuator according to claim 1, further comprising a spring connected to said first and second actuator layers to provide a restoring force in addition to the selected attractive force.

12. The repulsive-attractive-force electrostatic actuator according to claim 1, further comprising a spacer connected to one of said first and second actuator layers, said spacer defining a minimum spacing between said first and second actuator layers.

13. The repulsive-attractive-force electrostatic actuator according to claim 1, wherein a fifth electrode pattern is attached to said first substrate and a sixth electrode pattern is attached to said second substrate, and
- wherein a capacitance measured between said fifth and sixth electrode provides a measure of relative displacement between said first and second substrates.

14. The repulsive-attractive-force electrostatic actuator according to claim 1, wherein said first and second voltage sources are high-voltage sources each capable of providing a voltage of at least 1 kV.

15. The repulsive-attractive-force electrostatic actuator according to claim 1, wherein said first and second voltage sources are high-voltage sources each capable of providing a voltage of between 1 kV to 5 kV.

16. The repulsive-attractive-force electrostatic actuator according to claim 1, further comprising:
- a third actuator layer spaced apart from said first and second actuator layers with at least one of a vacuum, air, a gas or a dielectric material therebetween, said third actuator layer comprising:
  - a third substrate of a third dielectric material having a transverse thickness and two opposing surfaces,
  - a fifth electrode pattern at least one of attached to or formed on one of said two opposing surfaces of said third substrate, and
  - a sixth electrode pattern at least one of attached to or formed on the other one of said two opposing surfaces of said third substrate so as to be on an opposing side with respect to said fifth electrode pattern, and
  - wherein said fifth and sixth electrode patterns are substantially aligned with each other in a direction of said transverse thickness on said two opposing surfaces of said third substrate; and
- a third voltage source connected to said fifth and sixth electrode patterns such that, during operation, each is entirely at a common voltage across the corresponding electrode pattern, said fifth electrode pattern is at an opposite voltage relative to said sixth electrode pattern having a relative voltage of $V_3$;

wherein said first, second and third voltage sources have a common ground, and wherein said applied relative voltages $V_1$, $V_2$ and $V_3$ are selectable to provide one of a selected repulsive force or a selected attractive force between adjacent pairs of said first, second and third actuator layers.

17. A steerable optical component, comprising:
an optical component attached to an assembly which allows motion in at least one degree of freedom; and
the repulsive-attractive-force electrostatic actuator according to claim 1 arranged in mechanical connection with said optical component.

18. A surface coating comprising a plurality of repulsive-attractive-force electrostatic actuators according to claim 1 arranged in an array to control interaction of at least one of a fluid or electromagnetic radiation interactions with a surface coated therewith.

19. A robotic device comprising a plurality of repulsive-attractive-force electrostatic actuators according to claim 1 arranged to effect motion of said robotic device.

20. A biological cell growth device comprising a plurality of repulsive-attractive-force electrostatic actuators according to claim 1 arranged to effect motion of biological cells being grown or maintain therein.

21. A multi-substrate repulsive-attractive-force electrostatic actuator, comprising:
a first actuator layer comprising:
  a first substrate of a first dielectric material having a transverse thickness and two opposing surfaces,
  a first electrode pattern at least one of attached to or formed on one of said two opposing surfaces of said first substrate, and
  a second electrode pattern at least one of attached to or formed on the other one of said two opposing surfaces of said first substrate so as to be on an opposing side with respect to said first electrode pattern,
  wherein said first and second electrode patterns are substantially aligned with each other in a direction of said transverse thickness on said two opposing surfaces of said first substrate,
  a second substrate of a second dielectric material having a transverse thickness and two opposing surfaces, at least one of attached to or formed on the other one of said two opposing surfaces of said second electrode pattern so as to be on an opposing side with respect to said first substrate, and
  a third electrode pattern at least one of attached to or formed on the other one of said two opposing surfaces of said second substrate so as to be on an opposing side with respect to said second electrode pattern,
a first voltage source connected to said first and second electrode patterns such that, during operation, each is entirely at a common voltage across the corresponding electrode pattern, said first electrode pattern is at a relative voltage of $V_1$ to said second electrode pattern, and
a second voltage source connected to said second and third electrode patterns such that, during operation, each is entirely at a common voltage across the corresponding electrode pattern, said second electrode pattern is at a relative voltage of $V_2$ to said third electrode pattern;

a second actuator layer spaced apart from said first actuator layer with at least one of a vacuum, air, a gas or a dielectric material therebetween, said second actuator layer comprising:
  a third substrate of a third dielectric material having a transverse thickness and two opposing surfaces,
  a fourth electrode pattern at least one of attached to or formed on one of said two opposing surfaces of said third substrate,
  a fifth electrode pattern at least one of attached to or formed on the other one of said two opposing surfaces of said third substrate so as to be on an opposing side with respect to said fourth electrode pattern,
  wherein said fourth and fifth electrode patterns are substantially aligned with each other in a direction of said transverse thickness on said two opposing surfaces of said third substrate,
  a fourth substrate of a fourth dielectric material having a transverse thickness and two opposing surfaces, at least one of attached to or formed on the other one of said two opposing surfaces of said fifth electrode pattern so as to be on an opposing side with respect to said third substrate, and
  a sixth electrode pattern at least one of attached to or formed on the other one of said two opposing surfaces of said fourth substrate so as to be on an opposing side with respect to said fifth electrode pattern;
a third voltage source connected to said fourth and fifth electrode patterns such that, during operation, each is entirely at a common voltage across the corresponding electrode pattern, said fourth electrode pattern is at a relative voltage of $V_3$ to said fifth electrode pattern;
a fourth voltage source connected to said fifth and sixth electrode patterns such that, during operation, each is entirely at a common voltage across the corresponding electrode pattern, said fifth electrode pattern is at a relative voltage of $V_4$ to said sixth electrode pattern;
wherein said applied relative voltages $V_1$, $V_2$, $V_3$, and $V_4$ are selectable to provide one of a selected repulsive force or a selected attractive force between said first and second actuator layers.

22. The multi-substrate repulsive-attractive-force electrostatic actuator according to claim 21, further comprising:
a third actuator layer spaced apart from said second actuator layer with at least one of a vacuum, air, a gas or a dielectric material therebetween, said third actuator layer comprising:
  a fifth substrate of a fifth dielectric material having a transverse thickness and two opposing surfaces,
  a seventh electrode pattern at least one of attached to or formed on one of said two opposing surfaces of said fifth substrate,
  an eighth electrode pattern at least one of attached to or formed on the other one of said two opposing surfaces of said fifth substrate so as to be on an opposing side with respect to said seventh electrode pattern,
  wherein said seventh and eighth electrode patterns are substantially aligned with each other in a direction of said transverse thickness on said two opposing surfaces of said fifth substrate,
  a sixth substrate of a sixth dielectric material having a transverse thickness and two opposing surfaces, at least one of attached to or formed on the other one of said two opposing surfaces of said eighth electrode pattern so as to be on an opposing side with respect to said fifth substrate, and a ninth electrode pattern at least one of attached to or formed on the other one of said two opposing surfaces of said sixth substrate so as to be on an opposing side with respect to said eighth electrode pattern;

a fifth voltage source connected to said seventh and eighth electrode patterns such that, during operation, each is entirely at a common voltage across the corresponding electrode pattern, said seventh electrode pattern is at a relative voltage of $V_5$ to said eighth electrode pattern; and a sixth voltage source connected to said eighth and ninth electrode patterns such that, during operation, each is entirely at a common voltage across the corresponding electrode pattern, said eighth electrode pattern is at a relative voltage of $V_6$ to said ninth electrode pattern, wherein said applied relative voltages $V_1$, $V_2$, $V_3$, $V_4$, $V_5$ and $V_6$ are selectable to provide one of a selected repulsive force or a selected attractive force between said first and second actuator layers and between said second and third actuator layers.

* * * * *